US008558158B2

(12) United States Patent
Izuha et al.

(10) Patent No.: US 8,558,158 B2
(45) Date of Patent: Oct. 15, 2013

(54) SOLID-STATE IMAGING DEVICE, MANUFACTURING METHOD AND DESIGNING METHOD THEREOF, AND ELECTRONIC DEVICE

(75) Inventors: Kyoko Izuha, Kanagawa (JP); Hiromi Okazaki, Kanagawa (JP); Yoshiaki Kitano, Kumamoto (JP)

(73) Assignee: Sony Corporation, Tokyo (JP)

( * ) Notice: Subject to any disclaimer, the term of this patent is extended or adjusted under 35 U.S.C. 154(b) by 427 days.

(21) Appl. No.: 12/915,638

(22) Filed: Oct. 29, 2010

(65) Prior Publication Data

US 2011/0108705 A1    May 12, 2011

(30) Foreign Application Priority Data

Nov. 6, 2009   (JP) ................................ 2009-255445

(51) Int. Cl.
*H01L 27/148*   (2006.01)
*H01L 31/0232*  (2006.01)

(52) U.S. Cl.
USPC ........ 250/208.1; 250/226; 257/432; 257/294; 257/E27.133; 438/73

(58) Field of Classification Search
USPC ....... 250/208.1, 226; 257/432, E27.133, 288, 257/290, 291, 294; 438/57, 69, 70, 73
See application file for complete search history.

(56) References Cited

U.S. PATENT DOCUMENTS

| | | | |
|---|---|---|---|
| 6,188,094 B1 * | 2/2001 | Kochi et al. | 257/232 |
| 6,252,219 B1 * | 6/2001 | Abe | 250/208.1 |
| 6,255,640 B1 * | 7/2001 | Endo et al. | 250/208.1 |
| 6,291,811 B1 * | 9/2001 | Ogawa | 250/208.1 |
| 6,518,639 B2 * | 2/2003 | Ueno et al. | 257/432 |
| 6,614,479 B1 * | 9/2003 | Fukusho et al. | 348/340 |
| 7,291,826 B2 * | 11/2007 | Vaillant | 250/214.1 |
| 7,453,109 B2 * | 11/2008 | Koizumi et al. | 257/291 |
| 7,504,681 B2 * | 3/2009 | Lim | 257/294 |
| 7,723,151 B2 * | 5/2010 | Lee | 438/71 |
| 8,252,614 B2 * | 8/2012 | Koizumi et al. | 438/48 |
| 8,258,456 B2 * | 9/2012 | Cheung | 250/226 |
| 2004/0012707 A1 * | 1/2004 | Fukusho et al. | 348/340 |
| 2005/0103983 A1 * | 5/2005 | Yamaguchi et al. | 250/214.1 |
| 2005/0110050 A1 * | 5/2005 | Walschap et al. | 257/222 |
| 2005/0236653 A1 * | 10/2005 | Lim | 257/294 |
| 2007/0012962 A1 * | 1/2007 | Rhodes | 257/290 |
| 2007/0120161 A1 * | 5/2007 | Cole | 257/292 |
| 2007/0205439 A1 * | 9/2007 | Okita et al. | 257/228 |
| 2009/0111208 A1 * | 4/2009 | Fan et al. | 438/70 |

(Continued)

FOREIGN PATENT DOCUMENTS

| | | |
|---|---|---|
| JP | 06-292206 | 10/1994 |
| JP | 2005-142510 | 6/2005 |
| JP | 2007-242694 | 9/2007 |

*Primary Examiner* — John Lee
(74) *Attorney, Agent, or Firm* — Dentons US LLP

(57) ABSTRACT

A solid-state imaging device includes a semiconductor substrate, photodiodes, a first insulating film, a second insulating film, a third insulating film, and a color filter. The photodiodes are disposed on the semiconductor substrate. The first insulating film covers a multilayer wiring on the semiconductor substrate. The first insulating film comprises a material having a first refractive index lower than a refractive index of the semiconductor substrate for at least bottom surface and top surface portions of the first insulating film. The second insulating film has a second refractive index higher than the first refractive index. The third insulating film has a third refractive index higher than the second refractive index.

15 Claims, 18 Drawing Sheets

(56) References Cited

U.S. PATENT DOCUMENTS

| | | |
|---|---|---|
| 2009/0200452 A1* | 8/2009 | Venezia et al. ............. 250/208.1 |
| 2010/0244169 A1* | 9/2010 | Maeda et al. ................ 257/432 |
| 2010/0301437 A1* | 12/2010 | Brown ......................... 257/432 |
| 2011/0108705 A1* | 5/2011 | Izuha et al. ................ 250/208.1 |
| 2011/0127412 A1* | 6/2011 | Cheung ........................ 250/226 |
| 2011/0156114 A1* | 6/2011 | Park et al. .................... 257/294 |
| 2012/0147241 A1* | 6/2012 | Yamaguchi et al. .......... 348/311 |

* cited by examiner

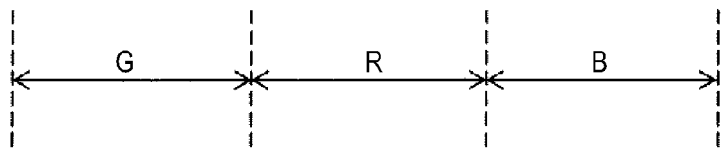
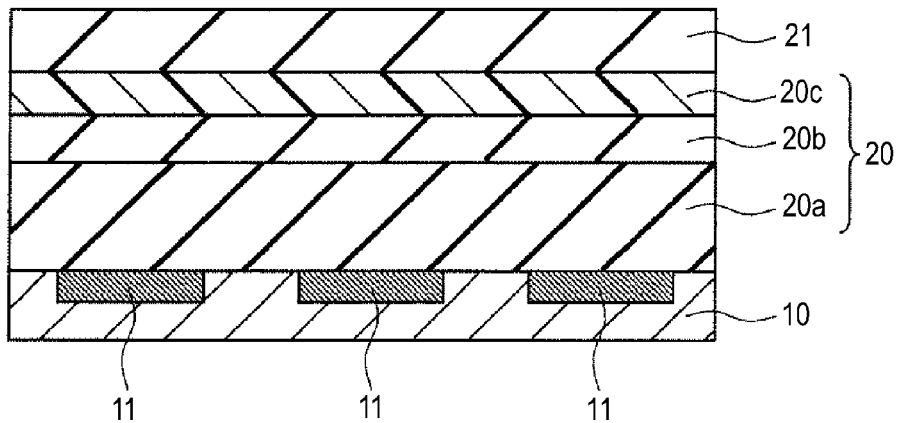
FIG.4A
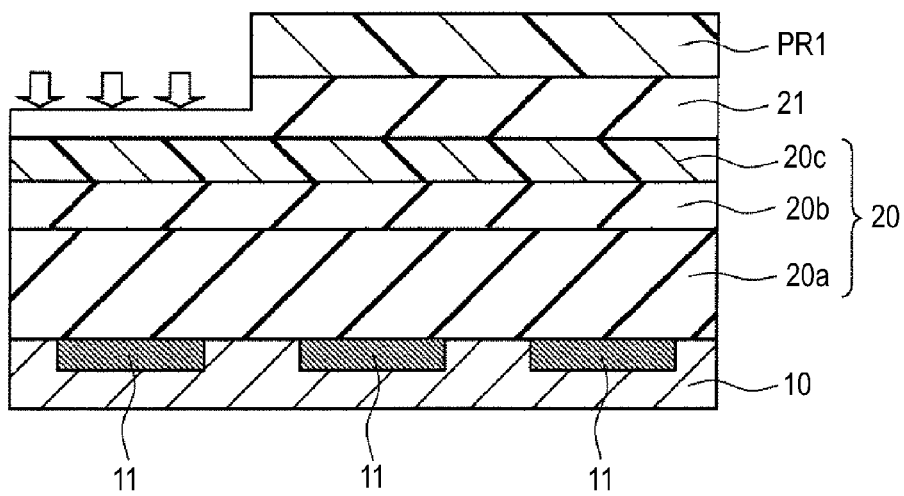
FIG.4B

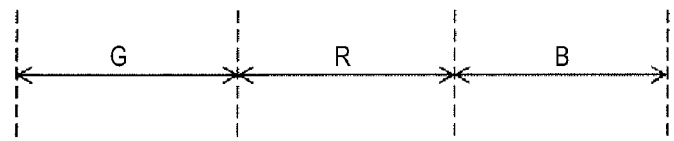
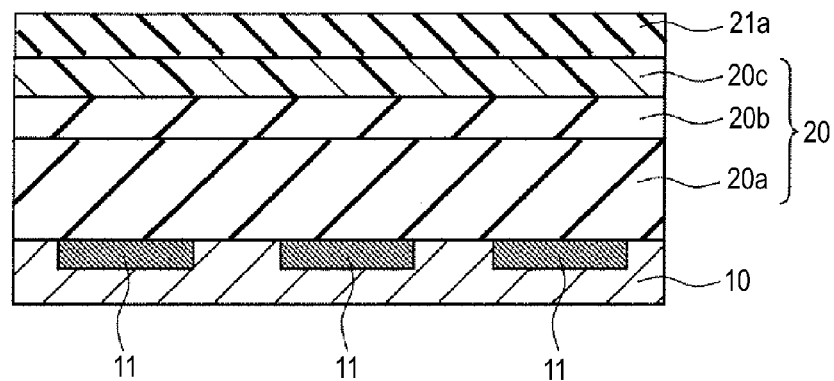
FIG.12A
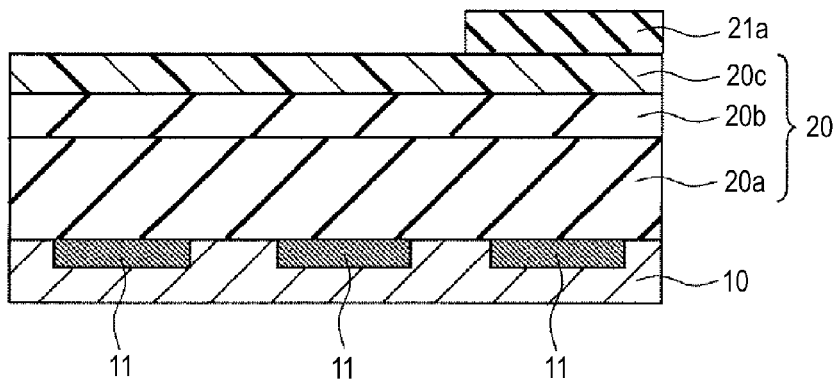
FIG.12B

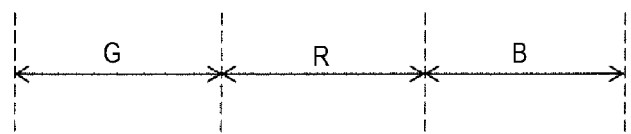
FIG.13A
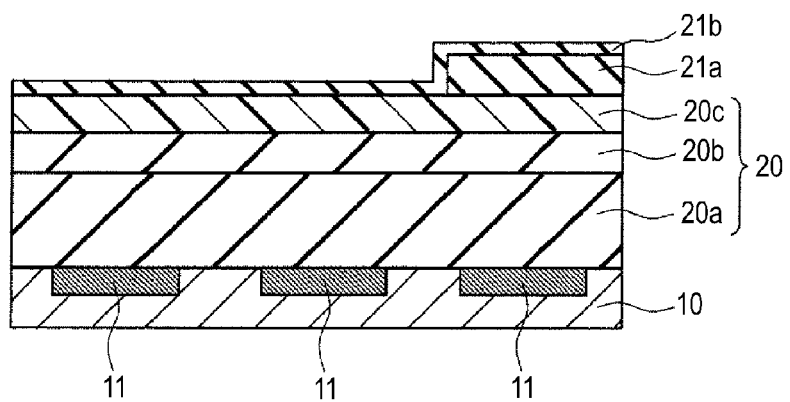
FIG.13B
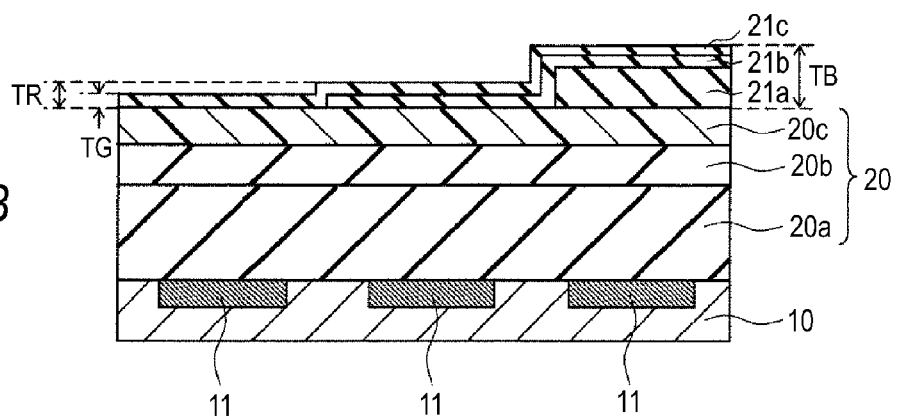

RELATED ART  FIG.20A
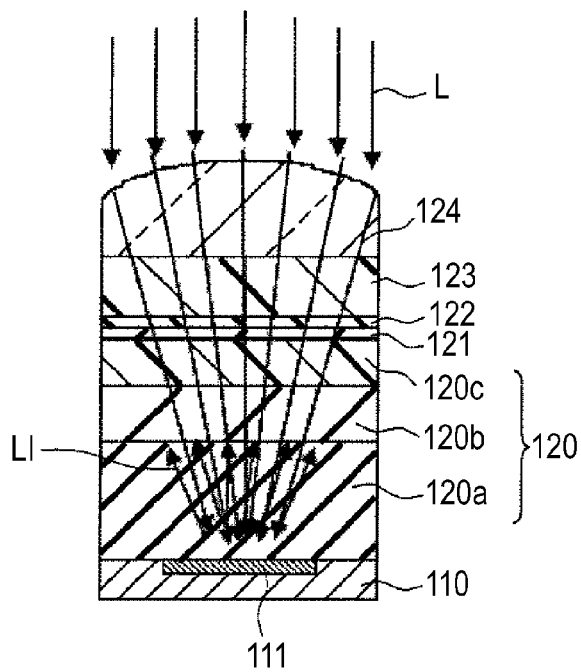
RELATED ART  FIG.20B
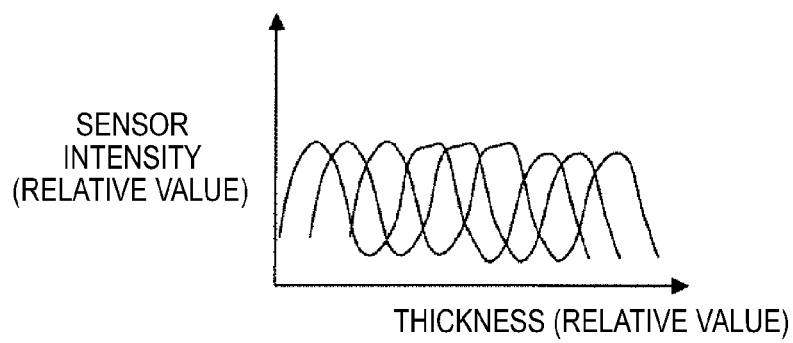
RELATED ART  FIG.20C
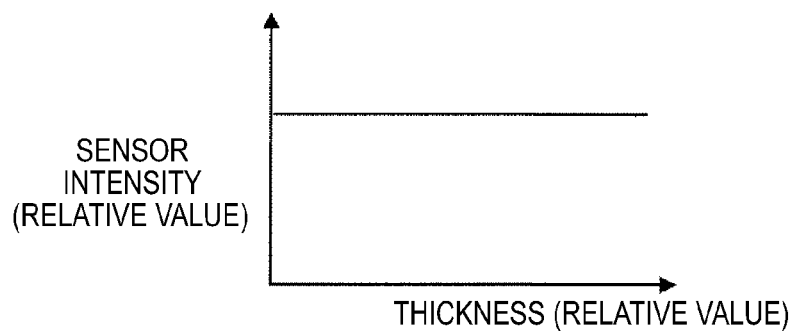

RELATED ART  FIG.21A
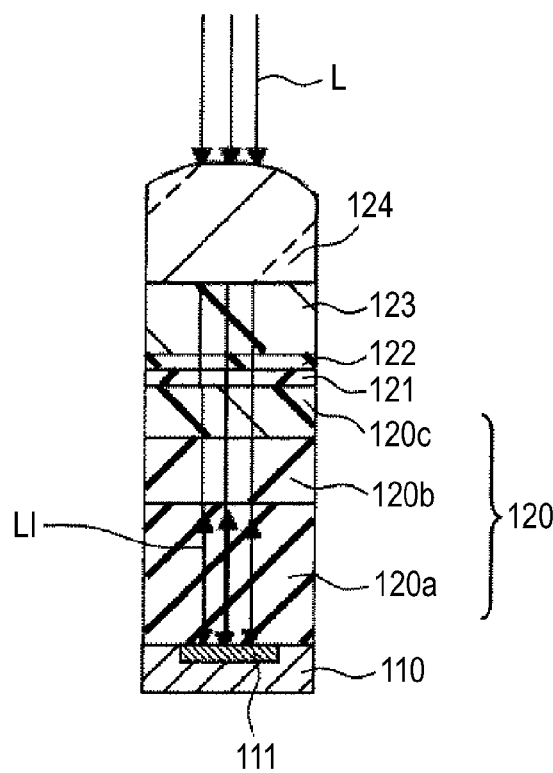
RELATED ART  FIG.21B
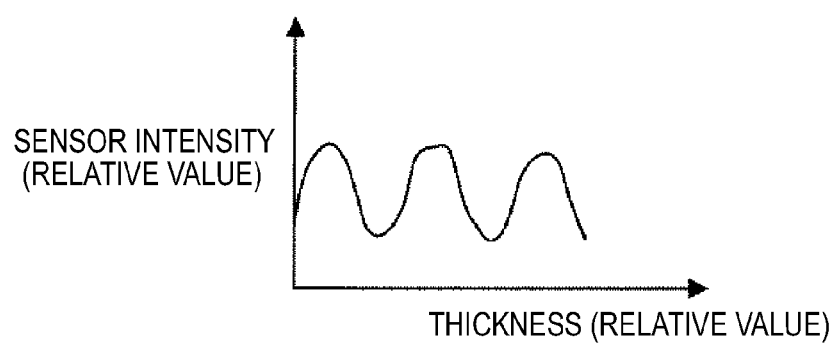

SOLID-STATE IMAGING DEVICE, MANUFACTURING METHOD AND DESIGNING METHOD THEREOF, AND ELECTRONIC DEVICE

BACKGROUND OF THE INVENTION

1. Field of the Invention

The present invention relates to solid-state imaging devices, manufacturing methods and designing methods thereof, and electronic devices, particularly to solid-state imaging devices that include R (red), G (green), and B (blue) color filters, manufacturing methods and designing methods thereof, and electronic devices.

2. Description of the Related Art

Electronic devices such as digital video electronic devices and digital still electronic devices include solid-state imaging devices, for example, such as CCD (Charge Coupled Device) image sensors, and CMOS (Complementary Metal-Oxide-Silicon Transistor) image sensors.

Such solid-state imaging devices include a plurality of pixels that is disposed in a matrix along the horizontal and vertical directions to form a light-receiving surface on a semiconductor substrate. On the light-receiving surface, a sensor, for example, such as a photodiode, is provided as a photoelectric converting section for each pixel. A light condensing structure that condenses the light of a subject image onto the sensor of each pixel is formed on the light-receiving surface. Once received, the light of a subject image is subjected to photoelectric conversion, and signal charges are generated to produce pixel signals.

In solid-state imaging devices that form color images, a color filter of red (R), green (G), or blue (B) is formed corresponding to each pixel.

FIG. 20A is a cross sectional view of a pixel of a solid-state imaging device of related art, representing the older generation of solid-state imaging device with the cell size of about 3 μm.

A photodiode 111 is formed on a semiconductor substrate 110 for each pixel, and a gate insulating film and gate electrodes (not illustrated) are formed on regions adjacent to the photodiode 111. The gate electrodes are controlled to perform processes that include transfer of the accumulated signal charges in the photodiode 111.

For example, a bottom-layer first insulating film 120a of, for example, silicon oxide, is formed over the whole surface, covering the components formed on the semiconductor substrate 110, including the photodiode 111 and the gate electrodes, so as to planarize irregularities created by the gate electrodes, etc.

For example, a second insulating film 120b of, for example, silicon nitride, and a third insulating film 120c of, for example, resin are formed on the first insulating film 120a. A fourth insulating film 121 of, for example, silicon oxynitride is formed thereon.

For example, a fifth insulating film 122 of, for example, silicon nitride is formed on the fourth insulating film 121.

A color filter 123 that transmits the light of wavelength, for example, in the red (R), green (G), or blue (B) region is formed for each pixel on the fifth insulating film 122. An on-chip lens 124 is formed on the color filter 123.

In the pixel of each color, the photodiode sensor provided for the pixel receives the light of wavelength corresponding to each color, and pixel signals for forming color images are obtained.

As the movement toward miniaturization of semiconductor integrated circuits continues, the condensing structure of the solid-state imaging device has become more complex than ever before. The finer device structure involving process variation complicates the light paths of the light passing through the condensing structure. This presents the problem of color nonuniformity during imaging.

Color nonuniformity is a phenomenon that occurs as a result of disrupted color balance in the incident light, caused by the wavelength-dependent intensity variation of the incident light on the sensor due to different thicknesses of the films forming the condensing structure.

An example of such color nonuniformity is color frame nonuniformity, which occurs when the color balance of the transmitted light is varied and disrupted at the central portion and the peripheral portion of the light-receiving surface by thickness variation, or intra-chip thickness variation as it is called, in which the extent of thickness changes in the film forming the condensing structure varies for the central portion and the peripheral portion of the light-receiving surface of the solid-state imaging device.

Color nonuniformity adds color to the field angle of image data, and thus reduces the yield of imaging device. Color nonuniformity becomes problematic in the generation of device with the cell size smaller than about 3 μm.

In the older generations with the cell size no smaller than about 3 μm, the on-chip lens and other lenses in the device bend the light, creating various angular components in the incident light on the sensor.

FIGS. 20B and 20C represent thickness dependence of the sensor intensity of the sensor of the foregoing configuration. The horizontal axis represents the thickness of a high-refractive-index film that has the interface that interferes with the reflected incident light at the silicon semiconductor substrate interface.

In the sensor of the foregoing configuration, as represented in FIG. 20B, the peaks and troughs of the interference light cancel out, and produce the thickness dependence as represented in FIG. 20C, i.e., sensor intensity with small thickness dependence.

In devices with a large cell pitch, the sensor intensity is constant for each wavelength of RGB, even when the thickness of the high-refractive-index film is varied by process variation, and color nonuniformity does not easily occur.

FIG. 21A is a cross sectional view of a pixel of a solid-state imaging device of related art with a cell size smaller than about 3 μm. This configuration is the same as that illustrated in FIG. 20A, except that the cell size is simply smaller.

In the pixel of such a configuration, the layer thickness remains the same despite the smaller cell pitch, and therefore, as illustrated in FIG. 21A, light is not bent through the lens in the device, and enters the sensor in the form of almost parallel rays with fewer angular components.

The light incident in this manner has only a single interference light component, and accordingly there is no canceling out of different light components.

FIG. 21B represents thickness dependence of the sensor intensity of the sensor of the foregoing configuration.

Because the thickness dependence of the single-component sensor intensity does not cancel out and remains, the sensor intensity varies with variation in the thickness of the high-refractive-index film, as represented in FIG. 21B.

FIG. 22 is a graph representing cell pitch plotted against the difference in sensitivity ratio (R/G) between a pixel at the center of a field angle and a pixel at an edge of the field angle. The graph has been normalized, and the vertical axis represents the difference in sensitivity ratio δ (relative value).

A similar graph can be obtained by normalizing the difference in sensitivity ratio (B/G) between a pixel at the center of the field angle and a pixel at an edge of the field angle.

Differences in sensitivity ratio between the center and edge of the field angle occur with cell pitches of 3 μm and smaller, showing that the cell pitch of 3 μm is the critical boundary. These differences are the cause of color nonuniformity.

In order to overcome the problem of color nonuniformity, JP-A-2007-242697 (Patent Document 1) proposes a structure that reduces color nonuniformity by suppressing interference using an antireflection film formed over and underneath a film of a high refractive index.

JP-A-6-292206 (Patent Document 2) proposes a device that includes a reflection preventing structure to reduce reflection of light.

JP-A-2005-142510 (Patent Document 3) proposes a device in which the thickness of an antireflection film directly above a light receiving section is varied for each different wavelength to suppress the intensity of reflected light, and to thereby improve light receiving efficiency.

The method of Patent Document 1 is intended to suppress color nonuniformity by reducing reflection at the high-refractive-index film that produces the color nonuniformity-causing interference light. For this purpose, the antireflection film of a constant thickness is formed over and beneath the high-refractive-index film. The constant thickness of the antireflection film is the average of the thickness that reduces red (R) reflected light near the wavelength 620 nm, and the thickness that reduces green (G) reflected light near the wavelength 550 nm.

However, color nonuniformity cannot be suppressed effectively with this method, because the method does not take into account the wavelength of blue (B) light near 440 nm, and because the interference light that causes color nonuniformity is sensitive to the thicknesses of the antireflection film and the high-refractive-index film.

This is explained below with reference to the structure illustrated in FIG. 21A. The structure illustrated in FIG. 21A represents a common structure of solid-state imaging devices such as CCD image sensors and CMOS image sensors.

Components such as the gate insulating film and gate electrodes (not illustrated) are formed on the semiconductor substrate 110 in regions adjacent to the photodiode 111 formed on the semiconductor substrate 110 for each pixel. The gate electrodes are controlled to perform processes that include transfer of the accumulated signal charges in the photodiode 111.

For example, a bottom-layer first insulating film 120a of, for example, silicon oxide, is formed over the whole surface, covering the components formed on the semiconductor substrate 110, including the photodiode 111 and the gate electrodes, so as to planarize irregularities created by the gate electrodes, etc.

For example, a second insulating film 120b of, for example, silicon nitride, and a third insulating film 120c of, for example, resin are formed on the first insulating film 120a. A fourth insulating film 121 of, for example, silicon oxynitride is formed thereon.

For example, a fifth insulating film 122 of, for example, silicon nitride is formed on the fourth insulating film 121.

Color nonuniformity occurs, for example, as a result of variation in optical interference intensity due to the reflected incident light at the surface of the semiconductor substrate, and the reflected light at the interface between the fourth insulating film 121 and the fifth insulating film 122.

SUMMARY OF THE INVENTION

The present inventors have recognized a problem in the solid-state imaging devices of related art, specifically, difficulties in suppressing color nonuniformity, for example, in the generation of solid-state imaging device that forms color images particularly with a cell pitch of 3 μm or less.

According to an embodiment of the present invention, there is provided a solid-state imaging device that includes: a semiconductor substrate that includes a photodiode separately provided for each of pixels disposed in a matrix on a light-receiving surface; a first insulating film formed on the semiconductor substrate so as to cover multilayer wiring formed on and in contact with the semiconductor substrate, wherein the first insulating film is formed using material of a first refractive index lower than a refractive index of the semiconductor substrate for at least bottom surface and top surface portions of the first insulating film; a second insulating film of a second refractive index higher than the first refractive index formed on the first insulating film; a third insulating film of a third refractive index higher than the second refractive index formed on the second insulating film; and a color filter formed on the third insulating film in a corresponding manner with each pixel so as to transmit light in a wavelength region of red, green, or blue, wherein the thickness and/or the second refractive index of the second insulating film for a pixel with the color filter of red, green, or blue differ from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

In the solid-state imaging device according to the embodiment of the present invention, multilayer wiring is formed on and in contact with the semiconductor substrate that includes a photodiode separately provided for each of pixels disposed in a matrix on a light-receiving surface. The first insulating film is formed on the semiconductor substrate so as to cover the multilayer wiring, using material of a first refractive index lower than a refractive index of the semiconductor substrate for at least bottom surface and top surface portions of the first insulating film. The second insulating film of a second refractive index higher than the first refractive index is formed on the first insulating film. The third insulating film of a third refractive index higher than the second refractive index is formed on the second insulating film. The color filter is formed on the third insulating film in a corresponding manner with each pixel so as to transmit light in a wavelength region of red, green, or blue.

The thickness and/or the second refractive index of the second insulating film for a pixel with the color filter of red, green, or blue differ from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

According to another embodiment of the present invention, there is provided a method for manufacturing a solid-state imaging device including the steps of: forming a photodiode separately for each of pixels disposed in a matrix on a light-receiving surface of a semiconductor substrate; forming multilayer wiring on the semiconductor substrate in contact therewith, and forming a first insulating film on the semiconductor substrate so as to cover the multilayer wiring, wherein the first insulating film is formed using material of a first refractive index lower than a refractive index of the semiconductor substrate for at least bottom surface and top surface portions of the first insulating film; forming a second insulating film of a second refractive index higher than the first refractive index on the first insulating film; forming a third insulating film of a third refractive index higher than the second refractive index on the second insulating film; and forming a color filter on the third insulating film in a corresponding manner with each pixel so as to transmit light in a wavelength region of red, green, or blue, wherein, in the step of forming the second insulating film, the thickness and/or the second refractive index of the second insulating film for a pixel with the color filter of red, green, or blue are made different from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

In the solid-state imaging device manufacturing method of the embodiment of the present invention, a photodiode is separately formed for each of pixels disposed in a matrix on a light-receiving surface of a semiconductor substrate, and multilayer wiring is formed on the semiconductor substrate in contact therewith. The first insulating film is formed on the semiconductor substrate so as to cover the multilayer wiring, using material of a first refractive index lower than a refractive index of the semiconductor substrate for at least bottom surface and top surface portions of the first insulating film. The second insulating film of a second refractive index higher than the first refractive index is formed on the first insulating film. The third insulating film of a third refractive index higher than the second refractive index is formed on the second insulating film. The color filter is formed on the third insulating film in a corresponding manner with each pixel so as to transmit light in a wavelength region of red, green, or blue.

In the step of forming the second insulating film, the thickness and/or the second refractive index of the second insulating film for a pixel with the color filter of red, green, or blue are made different from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

According to still another embodiment of the present invention, there is provided a method for designing a solid-state imaging device that includes: a semiconductor substrate that includes a photodiode separately provided for each of pixels disposed in a matrix on a light-receiving surface; a first insulating film formed on the semiconductor substrate so as to cover multilayer wiring formed on and in contact with the semiconductor substrate, wherein the first insulating film is formed using material of a first refractive index lower than a refractive index of the semiconductor substrate for at least bottom surface and top surface portions of the first insulating film; a second insulating film of a second refractive index higher than the first refractive index formed on the first insulating film; a third insulating film of a third refractive index higher than the second refractive index formed on the second insulating film; and a color filter formed on the third insulating film in a corresponding manner with each pixel so as to transmit light in a wavelength region of red, green, or blue, wherein the method designs the solid-state imaging device in such a manner that the thickness and/or the second refractive index of the second insulating film for a pixel with the color filter of red, green, or blue differ from the thickness and/or the second refractive index of the second insulating film for the other pixels, and that variation in the intensity of optical interference between reflected light at a surface of the semiconductor substrate, and reflected light at the interfaces between the first insulating film and the second insulating film and between the second insulating film and the third insulating film is reduced.

The solid-state imaging device designing method of the embodiment of the present invention is adapted to design a solid-state imaging device that includes: a photodiode separately provided for each of pixels disposed in a matrix on a light-receiving surface of the semiconductor substrate; multilayer wiring formed on the semiconductor substrate in contact therewith; a first insulating film formed on the semiconductor substrate so as to cover multilayer wiring, using material of a first refractive index lower than a refractive index of the semiconductor substrate for at least bottom surface and top surface portions of the first insulating film; a second insulating film of a second refractive index higher than the first refractive index formed on the first insulating film; a third insulating film of a third refractive index higher than the second refractive index formed on the second insulating film; and a color filter formed on the third insulating film in a corresponding manner with each pixel so as to transmit light in a wavelength region of red, green, or blue. The solid-state imaging device is designed so that the thickness and/or the second refractive index of the second insulating film for a pixel with the color filter of red, green, or blue differ from the thickness and/or the second refractive index of the second insulating film for the other pixels, and that variation in the intensity of optical interference between reflected light at a surface of the semiconductor substrate, and reflected light at the interfaces between the first insulating film and the second insulating film and between the second insulating film and the third insulating film is reduced.

According to yet another embodiment of the present invention, there is provided an electronic device that includes: a solid-state imaging device; an optical system that guides incident light to an imaging section of the solid-state imaging device; and a signal processing circuit that processes an output signal of the solid-state imaging device, the solid-state imaging device including: a semiconductor substrate that includes a photodiode separately provided for each of pixels disposed in a matrix on a light-receiving surface; a first insulating film formed on the semiconductor substrate so as to cover multilayer wiring formed on and in contact with the semiconductor substrate, wherein the first insulating film is formed using material of a first refractive index lower than a refractive index of the semiconductor substrate for at least bottom surface and top surface portions of the first insulating film; a second insulating film of a second refractive index higher than the first refractive index formed on the first insulating film; a third insulating film of a third refractive index higher than the second refractive index formed on the second insulating film; and a color filter formed on the third insulating film in a corresponding manner with each pixel so as to transmit light in a wavelength region of red, green, or blue, wherein the thickness and/or the second refractive index of the second insulating film for a pixel with the color filter of red, green, or blue differ from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

The electronic device of the embodiment of the present invention includes a solid-state imaging device, an optical system that guides incident light to an imaging section of the solid-state imaging device, and a signal processing circuit that processes an output signal of the solid-state imaging device.

The solid-state imaging device includes: a photodiode separately provided for each of pixels disposed in a matrix on a light-receiving surface of the semiconductor substrate; multilayer wiring formed on the semiconductor substrate in contact therewith; a first insulating film formed on the semiconductor substrate so as to cover the multilayer wiring, using material of a first refractive index lower than a refractive index of the semiconductor substrate for at least bottom surface and top surface portions of the first insulating film; a second insulating film of a second refractive index higher than the first refractive index formed on the first insulating film; a third insulating film of a third refractive index higher than the second refractive index formed on the second insulating film; and a color filter formed on the third insulating film in a corresponding manner with each pixel so as to transmit light in a wavelength region of red, green, or blue.

The thickness and/or the second refractive index of the second insulating film for a pixel with the color filter of red, green, or blue differ from the thickness and/or the second refractive index of the second insulating film for the other pixels so as to reduce variation in the intensity of optical interference between reflected light at a surface of the semiconductor substrate, and reflected light at the interfaces between the first insulating film and the second insulating film and between the second insulating film and the third insulating film.

With the solid-state imaging device of the embodiment of the present invention, variation in the optical interference intensity of the incident light on the light-receiving surface can be reduced to suppress color nonuniformity, for example, in the generation of solid-state imaging device that forms color images particularly with a cell pitch of 3 μm or less.

With the solid-state imaging device manufacturing method of the embodiment of the present invention, a solid-state imaging device, for example, the generation of solid-state imaging device that forms color images particularly with a cell pitch of 3 μm or less can be manufactured in which variation in the optical interference intensity of the incident light on the light-receiving surface can be reduced to suppress color nonuniformity.

With the solid-state imaging device designing method of the embodiment of the present invention, a solid-state imaging device, for example, the generation of solid-state imaging device that forms color images particularly with a cell pitch of 3 μm or less can be designed in which variation in the optical interference intensity of the incident light on the light-receiving surface can be reduced to suppress color nonuniformity.

With the electronic device according to the embodiment of the present invention, variation in the optical interference intensity of the incident light on the light-receiving surface can be reduced to suppress color nonuniformity, for example, in an electronic device that includes the generation of solid-state imaging device that forms color images particularly with a cell pitch of 3 μm or less.

BRIEF DESCRIPTION OF THE DRAWINGS

FIGS. 4A and 4B are cross sectional views illustrating manufacturing steps in a manufacturing method of the solid-state imaging device according to First Embodiment.

FIGS. 12A and 12B are cross sectional views illustrating manufacturing steps in a manufacturing method of the solid-state imaging device according to Third Embodiment.

FIGS. 13A and 13B are cross sectional views illustrating manufacturing steps in the manufacturing method of the solid-state imaging device according to Third Embodiment.

FIG. 20A is a cross sectional view of a solid-state imaging device of related art; FIGS. 20B and 20C are diagrams representing thickness dependence of the sensor intensity of a sensor having the configuration of FIG. 20A.

FIG. 21A is a cross sectional view of a solid-state imaging device of related art; FIG. 21B is a diagram representing thickness dependence of the sensor intensity of a sensor having the configuration of FIG. 21A.

DESCRIPTION OF THE PREFERRED EMBODIMENTS

The following describes embodiments of a solid-state imaging device, a manufacturing method and a designing method thereof, and an electronic device of the present invention with reference to the accompanying drawings.

Descriptions will be given in the following order.
1. First Embodiment (third insulating film has different thicknesses for RGB)
2. Second Embodiment (thickness range of third insulating film)
3. Third Embodiment (third insulating film as a laminated insulating film)
4. Fourth Embodiment (third insulating film has the same thickness for B as for R or G)
5. Fifth Embodiment (designing method of solid-state imaging device)
6. Sixth Embodiment (designing method of solid-state imaging device)
7. Seventh Embodiment (application to electronic device)

First Embodiment

Configuration of Solid-State Imaging Device

Figure 1:
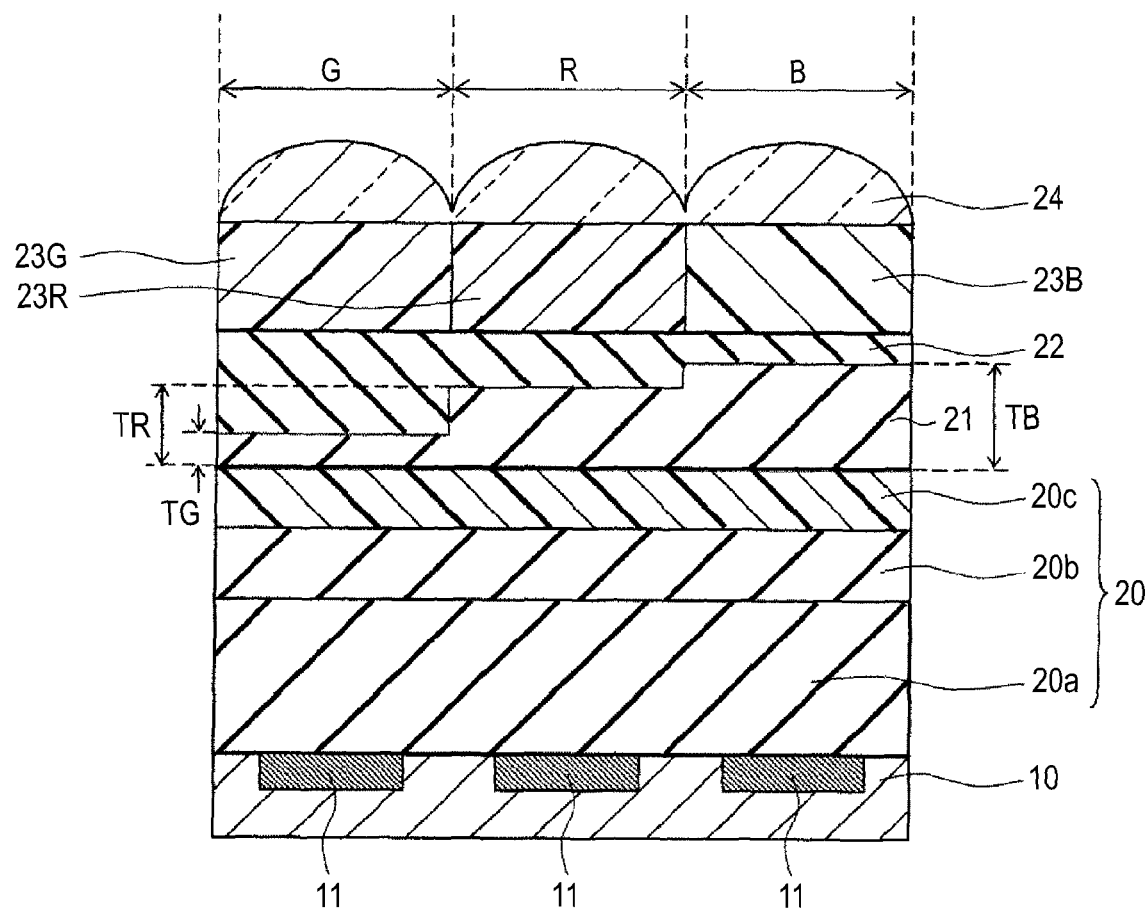
FIG. 1 is a cross sectional view of a solid-state imaging device according to First Embodiment of the present invention.

FIG. 1 is cross sectional view of pixels of a solid-state imaging device according to the present embodiment.

The figure shows a red pixel (R), a green pixel (G), and a blue pixel (B) that receive, for example, the wavelengths of the red, green, and blue regions, respectively.

For example, the red pixel (R), the green pixel (G), and the blue pixel (B) receive the wavelengths of 620 nm, 550 nm, and 440 nm, respectively.

A photodiode 11 is formed for each pixel of a semiconductor substrate 10, and a gate insulating film of, for example, silicon oxide, and gate electrodes of, for example, polysilicon, are formed on the semiconductor substrate 10 in regions adjacent to the photodiodes 11. For example, transistors are formed for the transfer of signal charges that accumulate in the photodiodes.

In the present embodiment, the photodiodes are also called sensors, and the output intensity of the photodiodes is also referred to as sensor intensity.

For example, a bottom-layer first insulating film 20a of, for example, silicon oxide (refractive index of 1.45) is formed over the whole surface, covering the components formed on the semiconductor substrate 10, including the photodiodes 11 and the transistors (not illustrated), so as to planarize the irregularities created by components such as the gate electrodes of the transistors.

For example, a middle-layer first insulating film 20b of, for example, silicon nitride having ultraviolet absorbability (refractive index of 2.0) is formed on the bottom-layer first insulating film 20a.

A top-layer first insulating film 20c of, for example, resin (refractive index of 1.5), such as a heat-resistance heat-curable acrylic resin (JSS: manufactured by JSR Corporation) is formed over the middle-layer first insulating film 20b to planarize thickness differences.

The bottom-layer first insulating film 20a, the middle-layer first insulating film 20b, and the top-layer first insulating film 20c are laminated to form a first insulating film 20. At least the materials forming the bottom surface and top surface portions of the first insulating film 20 as above have a lower refractive index (first refractive index) than the refractive index of the semiconductor substrate 10.

Specifically, the bottom surface portion is formed using material such as silicon oxide, and the top surface portion is formed using material such as resin, both of which have a lower refractive index than the silicon semiconductor substrate 10. The first refractive index material may be the same or different for the bottom surface portion and the top surface portion.

A second insulating film 21, generally called an antireflection film, is formed, for example, on the first insulating film 20 by a method such as plasma CVD (Chemical Vapor Deposition), using, for example, silicon oxynitride (refractive index of 1.6).

A third insulating film 22 of, for example, silicon nitride (refractive index of 2.0) is formed as a protective film, for example, on the second insulating film 21.

A color filter (23B, 23G, 23R) that transmits light with the wavelength of, for example, the red (R), green (G), or blue (B) region is formed for each pixel on the third insulating film 22. An on-chip lens 24 is formed on the color filter (23B, 23G, 23R).

As noted above, the photodiode 11 is separately formed for each pixel disposed in a matrix on the light-receiving surface of the semiconductor substrate 10.

Multilayer wiring (not illustrated) is formed on the semiconductor substrate 10 in contact therewith, and the first insulating film 20 is formed on the semiconductor substrate 10 so as to cover the multilayer wiring, using the first refractive index material having a lower refractive index than the refractive index of the semiconductor substrate 10 for at least the bottom surface and top surface portions of the first insulating film 20.

The second insulating film 21 having a higher refractive index (second refractive index) than the first refractive index is formed on the first insulating film 20. The third insulating film 22 having a higher refractive index (third refractive index) than the second refractive index is formed on the second insulating film 21.

The color filter (23R, 23G, 23B) corresponding to each pixel is formed on the third insulating film 22, allowing passage of light of the wavelength in the red color, green color, or blue color region.

The thickness of the second insulating film 21 for the pixel with any one of the red, green, and blue color filters (23R, 23G, 23B) differs from the thicknesses of the second insulating film 21 for the other pixels.

Specifically, for example, as illustrated in FIG. 1, the second insulating film 21 has different thicknesses TR, TG, and TB for the red pixel (R), green pixel (G), and blue pixel (B), respectively. Common silicon oxynitride (refractive index of 1.6) is used to form the second insulating film 21 for the red pixel (R), green pixel (G), and blue pixel (B).

The second insulating film 21 configured as above is effective in the following respects.

Optical interference occurs between the reflected light at the surface of the semiconductor substrate 10, and the reflected light at the interfaces between the first insulating film 20 and the second insulating film 21 and between the second insulating film 21 and the third insulating film 22.

Color nonuniformity occurs as a result of variation in optical interference intensity. Color nonuniformity can be suppressed by reducing such variations in optical interference intensity.

In the present embodiment, the thickness of the second insulating film 21 is determined so as to reduce the thickness dependence of optical interference intensity, in the manner described below.

As described above, the surface of the second insulating film 21 has step differences, and the third insulating film 22 planarizes the step differences, as illustrated in FIG. 1. The third insulating film 22 is sufficiently larger than the step differences of the second insulating film 21, and thus able to absorb the adverse effects of the step differences by providing a flat surface.

The solid-state imaging device of the related art is configured to optimize the thickness of the second insulating film 21 according to light of, for example, 550 nm. However, as described above, the device is insufficient for reducing color nonuniformity.

Figure 2:
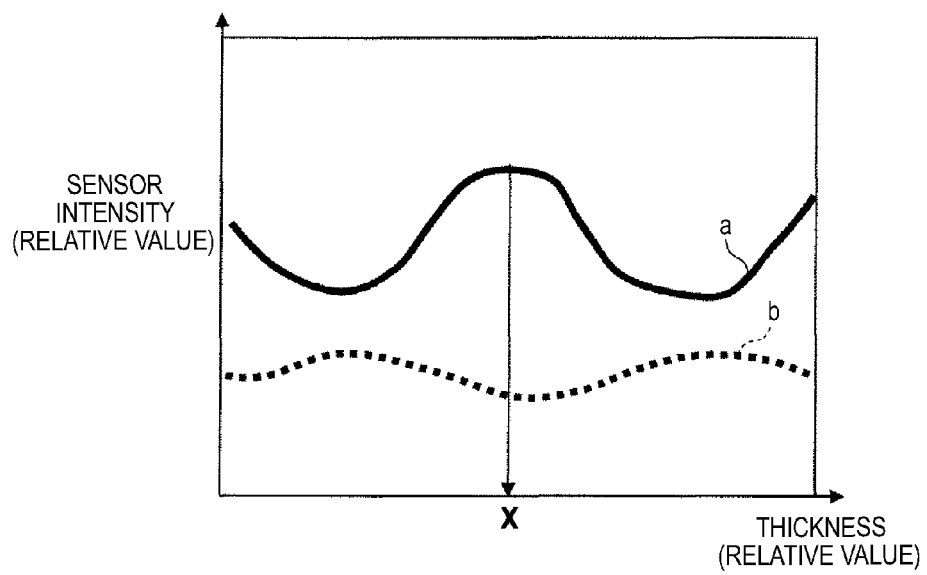
FIG. 2 is a diagram explaining color nonuniformity concerning the solid-state imaging device according to First Embodiment of the present invention.

FIG. 2 is a diagram explaining color nonuniformity. The figure represents thickness dependence of sensor intensity for red pixel (R) and green pixel (G).

FIG. 2 represents sensor intensity versus the thickness of the middle-layer first insulating film 20*b* for the green pixel receiving 550 nm light (solid line a), and for the red pixel receiving 620 nm light (dotted line b), with the second insulating film 21 set to a predetermined thickness value.

It can be seen that the sensor intensity periodically varies with changes in the thickness of the middle-layer first insulating film 20*b*, and that the middle-layer first insulating film 20*b* can thus be set to a thickness that would maximize the sensor intensity.

Further, it can be seen from FIG. 2 that the phase and amplitude of the sensor intensity vary according to wavelength. Specifically, while the point X at the maximum sensor intensity is the optimum thickness for the green pixel (G) (solid line a), X is not an optimal thickness for the red pixel (R) (dotted line b).

It is therefore difficult to determine an optimum thickness of the second insulating film 21 for both the green pixel (G) and the red pixel (R).

In the present embodiment, the thickness or thickness range of the second insulating film 21 is specified by accurately estimating the light incident characteristics for each wavelength in the solid-state imaging device that has a fine cell pitch of 3 μm or less.

Specifically, the requirement of light characteristics is satisfied through calculations of the incident light intensity on the sensor section based on the inputted thickness and refractive index of the film forming the solid-state imaging device. Here, the requirement of light characteristics is the requirement to reduce variation in optical interference intensity, specifically to minimize the thickness dependence of optical interference intensity.

In the present embodiment, the thickness of the second insulating film 21 is set for each of the red pixel (R), green pixel (G), and blue pixel (B).

For example, under varying thickness values set for the second insulating film 21, changes in sensor intensity with varying thicknesses of the middle-layer first insulating film 20*b* within a practical process variation range are determined by simulation. The simulation result is then used to set the thickness of the second insulating film 21.

Figure 3:
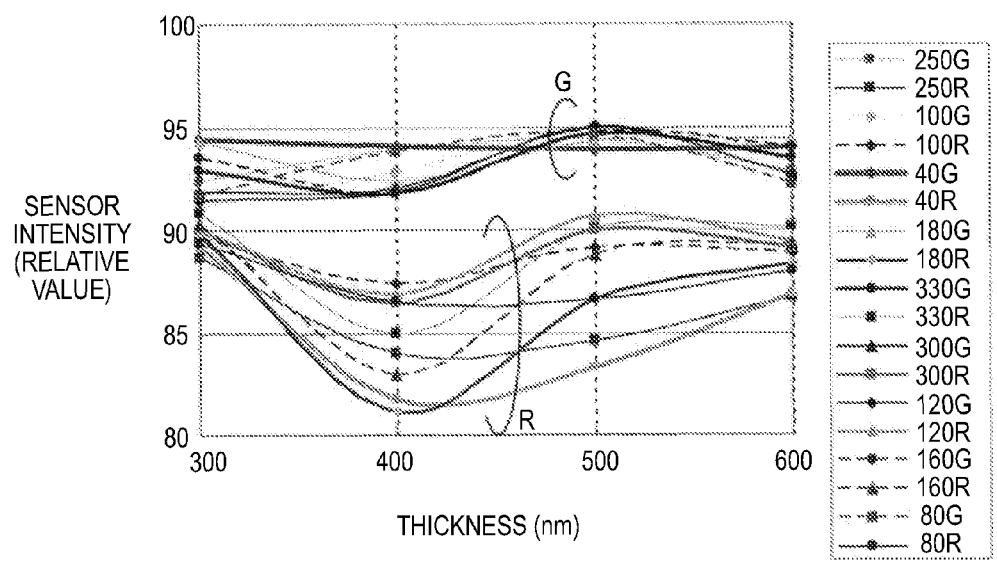
FIG. 3 is a diagram representing the relationship between sensor intensity and the thickness of a bottom-layer second insulating film in the solid-state imaging device according to First Embodiment of the present invention.

FIG. 3 represents the relationship between the sensor intensities of the red pixel (R) and green pixel (G) and the thickness of the middle-layer first insulating film 20*b*, when the thickness of the second insulating film 21 is varied from 40 nm to 330 nm.

The horizontal axis represents the thickness of the middle-layer first insulating film 20*b* as a representative example of process variation. In the graph of FIG. 3, the lines indicated by R and G are plotted values for the red and green pixels, respectively, under varying thicknesses of the second insulating film 21.

Varying the thickness of the middle-layer first insulating film 20*b* is to change the interference conditions of reflected light. It can be seen from FIG. 3 that the thickness dependence of sensor intensity is periodic according to the thickness of the insulating film, and that the amplitude varies according to the thickness of the second insulating film 21.

In devices with a fine cell pitch, the sensor intensity sensitively responds to thickness, as shown in the graph. As represented in FIG. 3, the sensor intensity responds differently for the red and green pixels. Specifically, the thickness of the second insulating film 21 needs to be determined according to the wavelength of incident light.

In FIG. 3, it is desirable to have a constant, unchanging sensor output. Constant sensor output means constant sensor intensity against process variation in the insulating film.

Referring to the graph from this perspective, the sensor intensity is stable when the thickness of the second insulating film 21 is preferably 100 nm for the wavelength of the red pixel (R), and 40 nm for the wavelength of the green pixel (G).

For the blue pixel (B), the preferred thickness of the second insulating film 21 is 180 nm.

In the present embodiment, the thickness of the second insulating film 21 is set to 100 nm, 40 nm, and 180 nm for the red pixel (R), green pixel (G), and blue pixel (B), respectively.

These thicknesses differ from the thickness proposed in Patent Document 1.

Further, the foregoing configuration distinguishes itself from the configuration of the Patent Document 3, which proposes to reduce the thickness in order of wavelength, specifically, in order from the red pixel (R), green pixel (G), and blue pixel.

With miniaturized cell sizes and the incident light approaching coherence, it is important to determine thickness for each wavelength.

With the solid-state imaging device of the present embodiment, variation in the optical interference intensity of the incident light on the light-receiving surface can be reduced to suppress color nonuniformity, for example, in the generation of solid-state imaging device that forms color images particularly with a cell pitch of 3 μm or less.

[Solid-State Imaging Device Manufacturing Method]

A manufacturing method of the solid-state imaging device of the present embodiment is described below with reference to FIGS. 4A and 4B and FIGS. 5A and 5B.

First, as illustrated in FIG. 4A, for example, a photodiode (not illustrated) is formed for each pixel on the silicon semiconductor substrate 10, and transistors including a gate insulating film of, for example, silicon oxide, and gate electrodes of, for example, polysilicon, and other components such as overlying wiring (not illustrated) are formed on regions adjacent to the photodiodes.

Then, the bottom-layer first insulating film 20*a* of, for example, silicon oxide is formed over the whole surface of the semiconductor substrate 10 by covering the transistors and other components, using, for example, a high-density plasma CVD method. Irregularities created by the transistors and the overlying wiring, etc. (not illustrated) are then planarized.

Thereafter, the middle-layer first insulating film 20b of, for example, silicon nitride having ultraviolet absorbability is formed on the bottom-layer first insulating film 20a, using, for example, a CVD method. Then, a resin such as a heat-resistance heat-curable acrylic resin is applied thereon to form the top-layer first insulating film 20c that planarizes the thickness step differences.

The bottom-layer first insulating film 20a, the middle-layer first insulating film 20b, and the top-layer first insulating film 20c are laminated in this manner to form the first insulating film 20.

Then, silicon oxynitride is deposited on the first insulating film 20 in a thickness of 180 nm using a method such as a plasma CVD method to form the second insulating film 21.

Thereafter, as illustrated in FIG. 4B, a photoresist film PR1 that protects the blue pixel (B) region and the red pixel (R) region is patterned, and the thickness of the second insulating film 21 is reduced in the green pixel (G) region by plasma etching using fluorine gas.

For example, the second insulating film 21 is etched 60 nm to reduce the thickness to 120 nm.

Figure 5A:
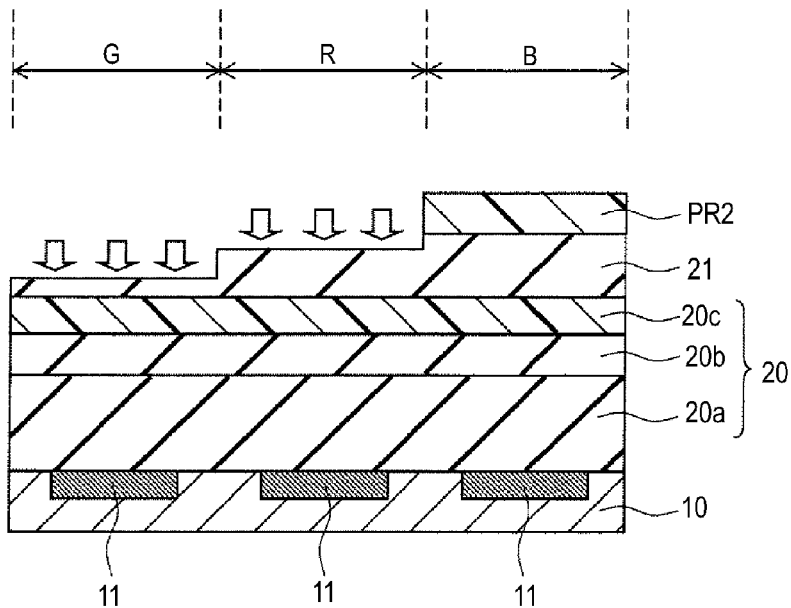
FIGS. 5A and 5B are cross sectional views illustrating manufacturing steps in the manufacturing method of the solid-state imaging device according to First Embodiment.

The photoresist film PR1 is removed, and, as illustrated in FIG. 5A, a photoresist film PR2 that protects the blue pixel (B) region is patterned, and the thickness of the second insulating film 21 in the green pixel (G) and red pixel (R) regions is reduced by plasma etching using fluorine gas.

For example, the second insulating film 21 is etched 80 nm to reduce the thickness to 40 nm in the green pixel region, and to 100 nm in the red pixel (R) region. The thickness remains at 180 nm in the blue pixel (B).

Figure 5B:
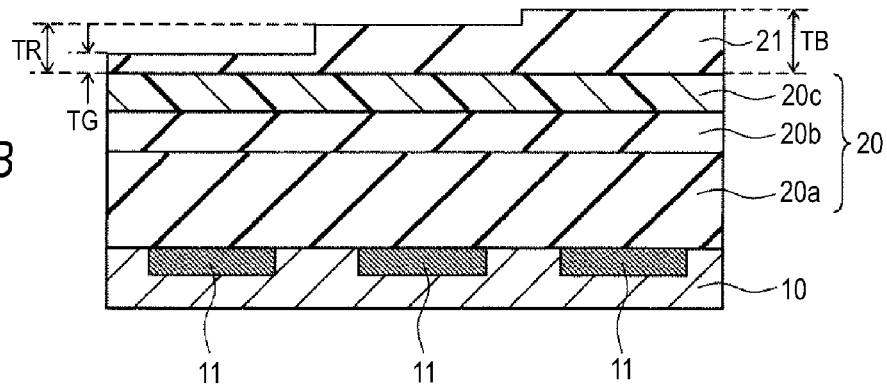

Then, as illustrated in FIG. 5B, the photoresist film PR2 is removed.

As a result, the second insulating film 21 has the thicknesses of 100 nm, 40 nm, and 180 nm in the red pixel (R), green pixel (G), and blue pixel (B), respectively.

Subsequently, for example, silicon nitride is deposited on the second insulating film 21 using a method such as a CVD method to form the third insulating film 22 as a protective film.

Then, for example, the color filter (23B, 23G, 23R) that transmits light of the wavelength in the red (R), green (G), or blue (B) region is formed for each pixel, and the on-chip lens 24 is formed on the color filter (23B, 23G, 23R).

With the solid-state imaging device manufacturing method of the present embodiment, a solid-state imaging device, for example, the generation of solid-state imaging device that forms color images particularly with a cell pitch of 3 μm or less can be manufactured in which variation in the optical interference intensity of the incident light on the light-receiving surface can be reduced to suppress color nonuniformity.

The solid-state imaging device manufacturing method of the present embodiment only adds the dry etching step to the manufacturing methods of the related art, and thus has a very limited impact on manufacture time.

The additional step has impact only about 1% of all the manufacturing steps.

In the present embodiment, the dependence of the optical interference intensity on the thickness of the second insulating film 21 is examined, taking into consideration the silicon semiconductor interface and changes in the thickness of the middle-layer first insulating film 20b of a high refractive index. However, the invention is not limited to this, and the film used to examine changes in optical interference intensity can be appropriately selected.

Further, in FIG. 3, the small amplitude is used as a factor to determine the thickness of the second insulating film 21. However, the invention is not limited to this.

Further, aside from the plasma etching, various processes can be used to obtain the desired thickness for the second insulating film 21.

Further, the invention is not limited to the foregoing configuration, and process stable devices, including imaging devices such as CCD image sensors and CMOS image sensors, can be fabricated by adding various structures to the solid-state imaging device of the present embodiment.

The invention is also applicable to solid-state imaging devices having an optical system or a layer configuration different from the configuration described above. For example, the invention is applicable to a configuration provided with an inner-layer lens.

It is not necessarily required to include all of the bottom-layer first insulating film 20a, the middle-layer first insulating film 20b, the top-layer first insulating film 20c, and the third insulating film 22 in this order. The layer configuration can be appropriately varied, as long as the first insulating film having a smaller refractive index (first refractive index) than the semiconductor substrate in at least the bottom surface and top surface portions of the first insulating film, the second insulating film of the second refractive index higher than the first refractive index, and the third insulating film of the third refractive index higher than the second refractive index are laminated on the semiconductor substrate.

In such configurations, the thickness of the second insulating film is set based on the result of the simulation intended to suppress variation of optical interference intensity.

This embodiment described the configuration in which the thickness of the second insulating film 21 for the pixel with any one of the red, green, and blue color filters (23R, 23G, 23B) differs from the thicknesses of the second insulating film 21 for the other pixels.

However, the invention is not limited to this, and the refractive index of the second insulating film 21 for the pixel with any one of the red, green, and blue color filters (23R, 23G, 23B) may differ from the refractive indices of the second insulating film 21 for the other pixels, as long as variation of optical interference intensity can be reduced. It is also possible to have a configuration in which the thickness and/or second refractive index of the second insulating film 21 for the pixel with any one of the red, green, and blue color filters (23R, 23G, 23B) differ from the thicknesses and/or second refractive indices of the second insulating film 21 for the other pixels.

Second Embodiment

Configuration of Solid-State Imaging Device

The solid-state imaging device according to the present embodiment is essentially the same as that described in First Embodiment.

Figure 6:
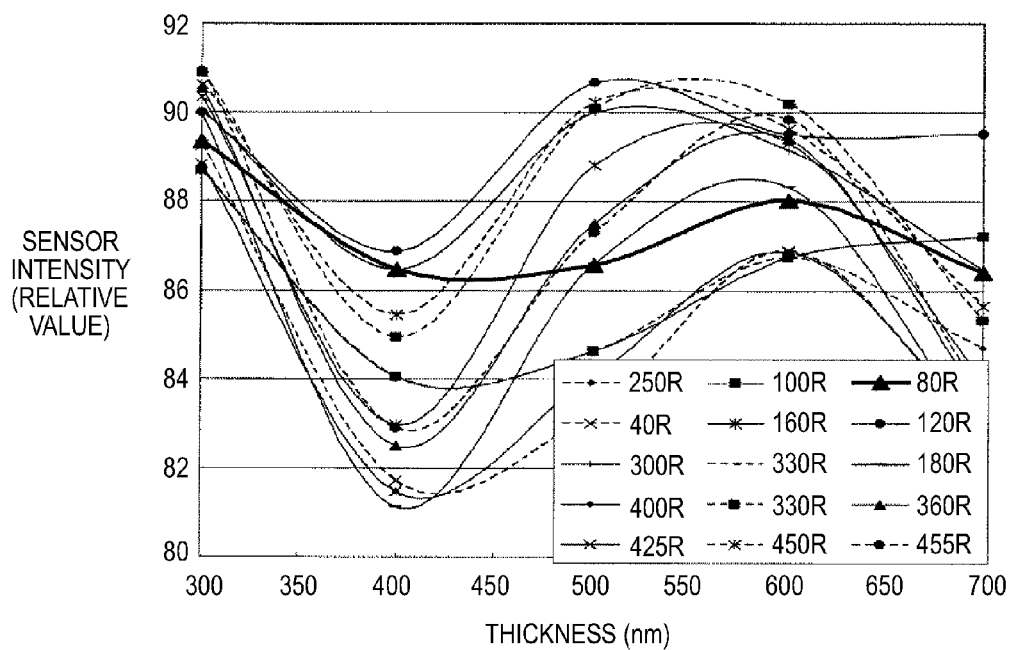
FIG. 6 is a diagram representing the relationship between sensor intensity and the thickness of a bottom-layer second insulating film in a solid-state imaging device according to Second Embodiment of the present invention.

FIG. 6 represents the relationship between the sensor intensity of the red pixel (R) and the thickness of the middle-layer first insulating film 20b under varying thicknesses of the second insulating film 21 over the range of 40 nm to 455 nm.

Figure 7:
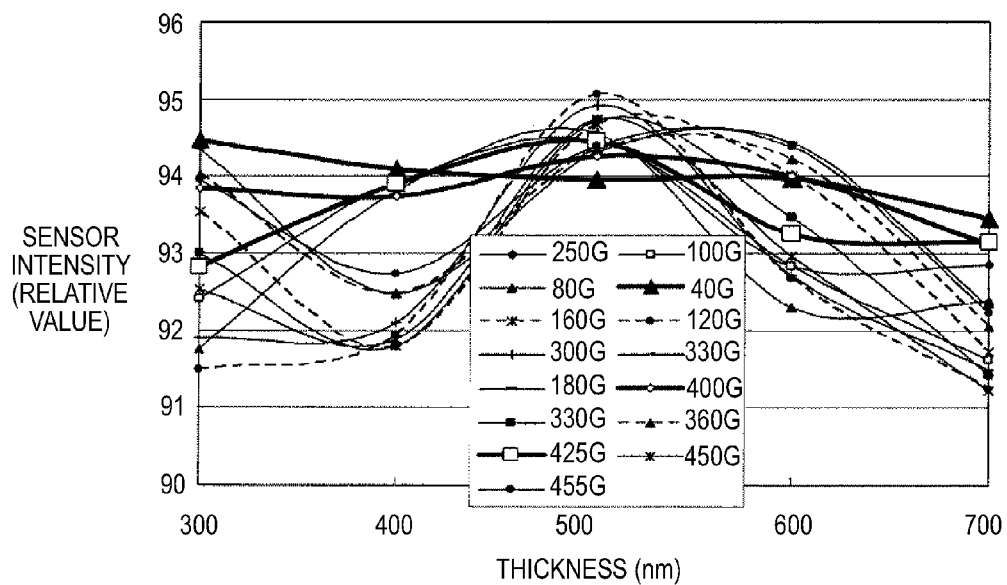
FIG. 7 is a diagram representing the relationship between sensor intensity and the thickness of the bottom-layer second insulating film in the solid-state imaging device according to Second Embodiment of the present invention.

FIG. 7 represents the relationship between the sensor intensity of the green pixel (G) and the thickness of the middle-layer first insulating film 20b under varying thicknesses of the second insulating film 21 over the range of 40 nm to 455 nm.

Figure 8:
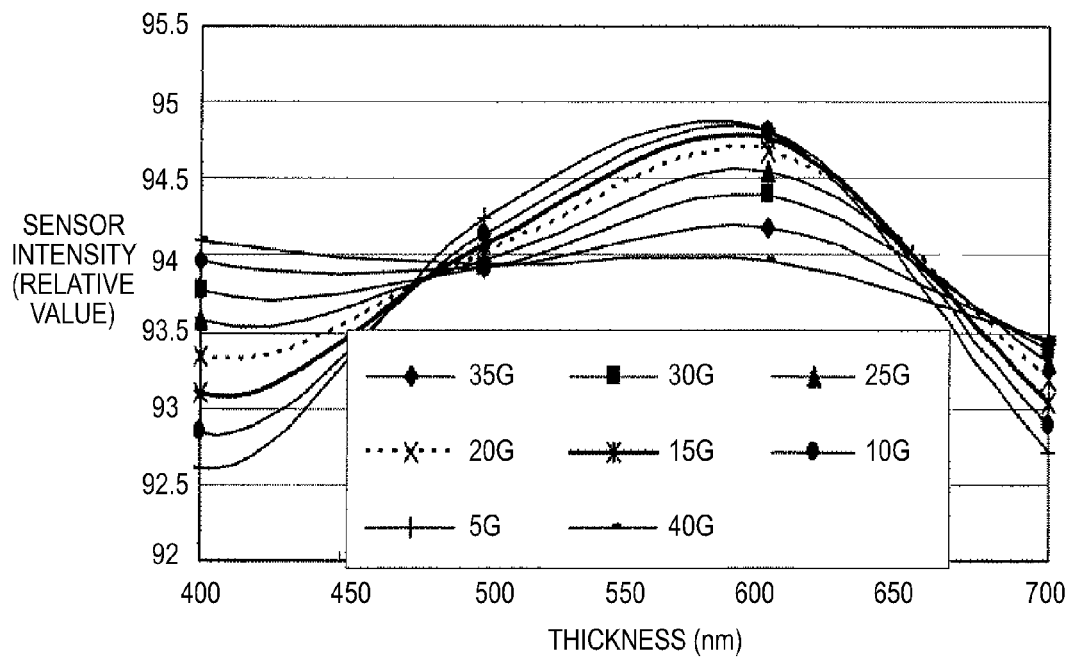
FIG. 8 is a diagram representing the relationship between sensor intensity and the thickness of the bottom-layer second insulating film in the solid-state imaging device according to Second Embodiment of the present invention.

FIG. 8 represents the relationship between the sensor intensity of the green pixel (G) and the thickness of the middle-layer first insulating film 20b under varying thicknesses of the second insulating film 21 over the range of 5 nm to 40 nm.

Figure 9:
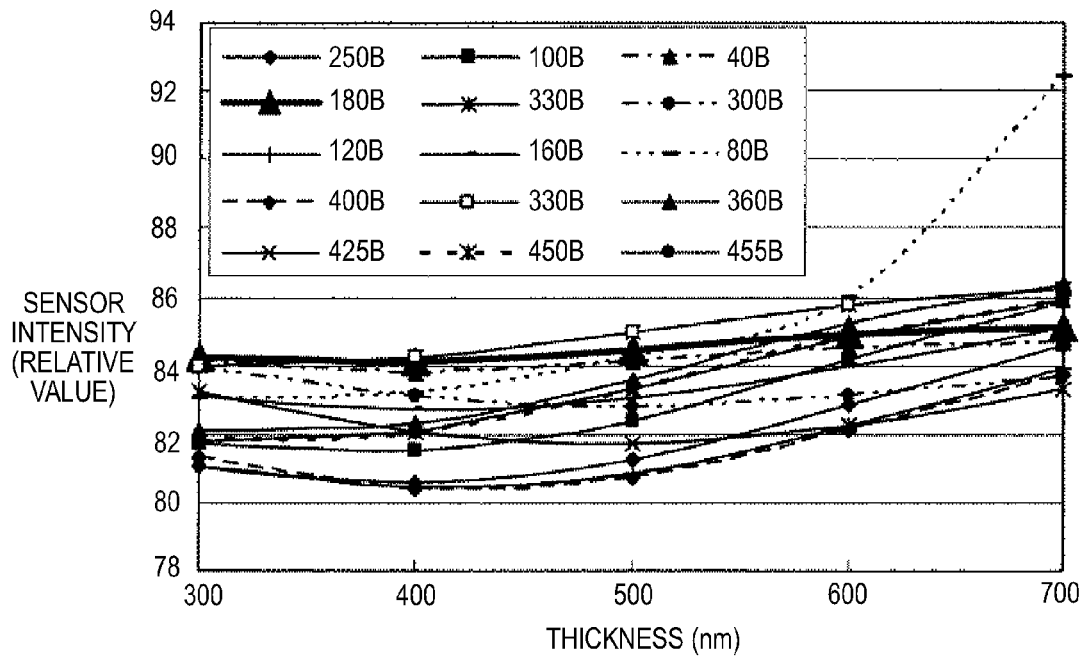
FIG. 9 is a diagram representing the relationship between sensor intensity and the thickness of the bottom-layer second insulating film in the solid-state imaging device according to Second Embodiment of the present invention.

FIG. 9 represents the relationship between the sensor intensity of the blue pixel (B) and the thickness of the middle-layer first insulating film 20b under varying thicknesses of the second insulating film 21 over the range of 40 nm to 455 nm.

Figure 10:
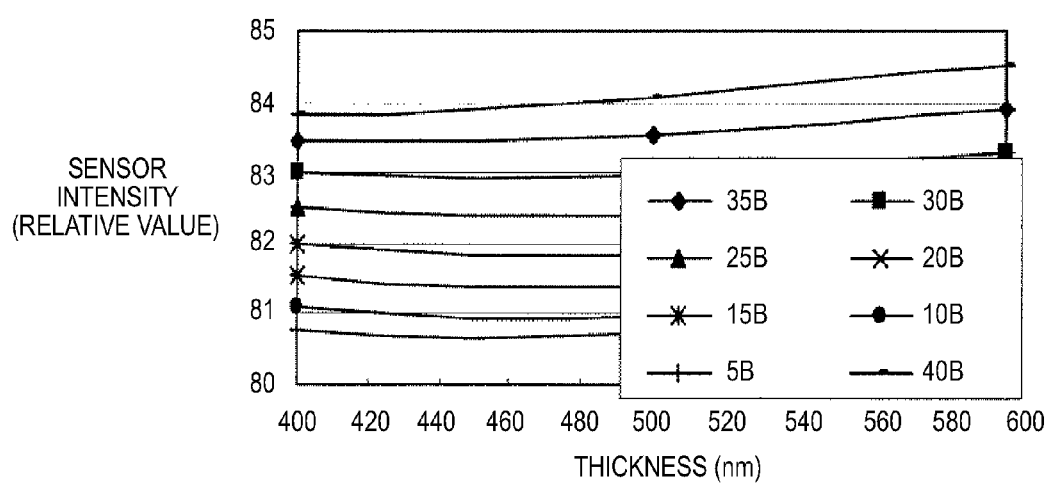
FIG. 10 is a diagram representing the relationship between sensor intensity and the thickness of the bottom-layer second insulating film in the solid-state imaging device according to Second Embodiment of the present invention.

FIG. 10 represents the relationship between the sensor intensity of the blue pixel (B) and the thickness of the middle-layer first insulating film 20b under varying thicknesses of the second insulating film 21 over the range of 5 nm to 40 nm.

Referring to FIG. 7, it can be seen that the thickness dependence of the sensor intensity on the middle-layer first insulating film 20b can be divided into three categories with respect to different thicknesses of the second insulating film 21.

The first category: The sensor intensity has almost no thickness dependence; the thickness of the second insulating film 21, 40 nm.

The second category: The thickness of the second insulating film 21, 80, 100, 250 nm.

The third category: The thickness of the second insulating film 21, 120, 160, 180, 300, 330 nm.

Of these three categories, the extent of changes on the vertical axis plotted against the horizontal axis is most stable in the first category in terms of the stability of sensor intensity, and becomes less stable in descending order from the first category to the second category and to the third category.

Thus, for the green pixel (G), the second insulating film 21 with the thickness ranges of 45 to 105 nm and 400 to 410 nm offers stability against process variation.

Similarly, for the red pixel (R), the stable thickness of the second insulating film 21 against process variation ranges from 70 to 130 nm, and the sensor intensity becomes unstable outside this range. This thickness range of the second insulating film 21 for the fabrication of a stable device against process variation is 70 nm to 130 nm for the red pixel (R).

Further, the thickness ranges of the second insulating film 21 for the fabrication of a stable device against process variation are 20 nm to 80 nm, and 160 nm to 250 nm for the blue pixel (B).

By looking at the stable thickness range of 20 to 140 nm against process variation, the stable thickness against process variation occurs in a 60-nm range for all of the blue pixel (B), green pixel (G), and red pixel (R), and the minimum value and the maximum value of the thickness range shift for each different wavelength.

It can be seen that the stable thickness ranges of 45 nm to 105 nm and 70 nm to 130 nm should be set for the green pixel (G) and the red pixel (R), respectively, with respect to the stable thickness range 20 nm to 80 nm of the blue pixel (B).

For example, the thickness of the second insulating film 21 for the red pixel (R), and the thickness of the second insulating film 21 for the green pixel (G) are different by (the wavelength of red light/4−the wavelength of green light/4).

The thickness of the second insulating film 21 for the green pixel (G) and the thickness of the second insulating film 21 for the blue pixel (B) are different by (the wavelength of green light/4−the wavelength of blue light/4).

The difference between the wavelength of red light/4 and the wavelength of green light/4, and the difference between the wavelength of red light/4 and the wavelength of green light/4 are about 25 nm. The preferable thickness range 45 to 105 nm for the green pixel (G) can be obtained by adding 25 nm to the stable thickness range 20 to 80 nm of the blue pixel (B). In the same manner, the preferable thickness range 70 to 130 nm for the red pixel (R) can be obtained by adding 25 nm to the preferable thickness range 45 to 105 nm of the green pixel (G).

The preferable thickness falls in the 60-nm range in each color.

In the present embodiment, the material of the second insulating film 21 is the same for the blue pixel, green pixel, and red pixel. However, the material of the second insulating film 21 may be different for each color, as long as the predetermined refractive index difference (for example, 0.2 or more) from the silicon semiconductor substrate can be realized.

In this case, the maximum value and the minimum value are shifted by the difference that corresponds to the product of (the wavelength of green light/4−the wavelength of blue light/4) and refractive index. Specifically, the thickness for the green pixel (G) ranges from the minimum value of the blue pixel (B) thickness range+(the wavelength of green light/4−the wavelength of blue light/4)*N (the refractive index of the third insulating film for the green pixel (G)) to the minimum value of the green pixel (G) thickness range+60 nm.

In Second Embodiment, the thickness range of the second insulating film 21 is set so that a stable device structure against process variation can be defined in more general terms, for example, by allowing device variations and process conditions to be set over wider ranges.

With the solid-state imaging device of the present embodiment, variation in the optical interference intensity of the incident light on the light-receiving surface can be reduced to suppress color nonuniformity, for example, in the generation of solid-state imaging device that forms color images particularly with a cell pitch of 3 μm or less.

Third Embodiment

Configuration of Solid-State Imaging Device

Figure 11:
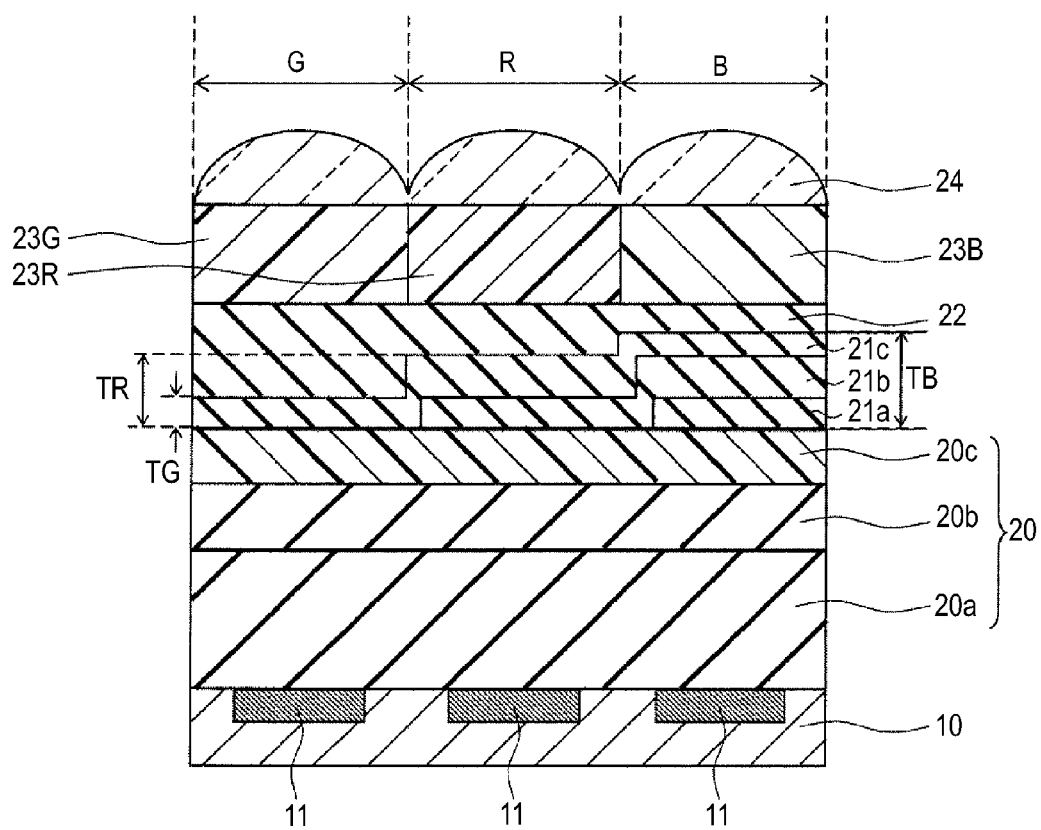
FIG. 11 is a cross sectional view of pixels of a solid-state imaging device according to Third Embodiment of the present invention.

FIG. 11 is a cross sectional view of pixels of a solid-state imaging device according to the present embodiment.

The second insulating film 21 is configured as the laminate of three layers: a bottom-layer second insulating film 21a, a middle-layer second insulating film 21b, and a top-layer second insulating film 21c.

The other configuration is essentially the same as the solid-state imaging device of First Embodiment.

With the solid-state imaging device of the present embodiment, variation in the optical interference intensity of the incident light on the light-receiving surface can be reduced to suppress color nonuniformity, for example, in the generation of solid-state imaging device that forms color images particularly with a cell pitch of 3 μm or less.

The bottom-layer second insulating film 21a, the middle-layer second insulating film 21b, and the top-layer second insulating film 21c may be formed using the same material, or partially or completely different materials may be used for these three films. For example, by using materials having different refractive indices, the refractive index of the second insulating film 21 can be adjusted for each different color.

[Solid-State Imaging Device Manufacturing Method]

A manufacturing method of the solid-state imaging device of the present embodiment is described below with reference to FIGS. 12A and 12B and FIGS. 13A and 13B.

First, as illustrated in FIG. 12A, the steps described in First Embodiment are followed up to the formation of the first insulating film 20.

Thereafter, silicon oxynitride is deposited on the first insulating film 20 in a thickness of 80 nm using a method such as a plasma CVD method, so as to form the bottom-layer second insulating film 21a.

Then, as illustrated in FIG. 12B, a photoresist film that protects the blue pixel (B) region is patterned, and the bottom-layer second insulating film 21a in the red pixel (R) and green pixel (G) regions is removed by plasma etching using fluorine gas.

As a result, the bottom-layer second insulating film 21a of 80-nm thick remains in the blue pixel (B) region.

Then, as illustrated in FIG. 13A, silicon oxynitride is deposited on the first insulating film 20 and the bottom-layer second insulating film 21a in a thickness of 60 nm using a method such as a plasma CVD method, so as to form the middle-layer second insulating film 21b.

Thereafter, as illustrated in FIG. 13B, a photoresist film that protects the blue pixel (B) region and the red pixel (R) region is patterned, and the middle-layer second insulating film 21b in the green pixel (G) region is removed by plasma etching using fluorine gas.

As a result, the middle-layer second insulating film 21b of 60-nm thick remains in the blue pixel (B) region and the red pixel (R) region. In the blue pixel (B) region, the bottom-layer second insulating film 21a and the middle-layer second insulating film 21b together form a 120-nm thick film.

Then, silicon oxynitride is deposited on the first insulating film 20 and the middle-layer second insulating film 21b in a thickness of 40 nm using a method such as a plasma CVD method, so as to form the top-layer second insulating film 21c.

As a result, in the blue pixel (B) region, the bottom-layer second insulating film 21a, the middle-layer second insulating film 21b, and the top-layer second insulating film 21c together form a film with a thickness TB of 180 nm.

In the red pixel (R) region, the middle-layer second insulating film 21b and the top-layer second insulating film 21c together form a film with a thickness TR of 100 nm.

In the green pixel (G) region, the top-layer second insulating film 21c has a thickness TG of 40 nm.

The bottom-layer second insulating film 21a, the middle-layer second insulating film 21b, and the top-layer second insulating film 21c are laminated in this manner to form the second insulating film 21.

Subsequently, for example, silicon nitride is deposited on the second insulating film 21 using a method such as a CVD method, so as to form the third insulating film 22 as a protective film.

Then, for example, the color filter (23B, 23G, 23R) that transmits light of the wavelength in the red (R), green (G), or blue (B) region is formed for each pixel, and the on-chip lens 24 is formed on the color filter (23B, 23G, 23R).

The other parts of the manufacturing method are essentially the same as the solid-state imaging device manufacturing method described in First Embodiment.

With the solid-state imaging device manufacturing method of the present embodiment, a solid-state imaging device, for example, the generation of solid-state imaging device that forms color images particularly with a cell pitch of 3 µm or less can be manufactured in which variation in the optical interference intensity of the incident light on the light-receiving surface can be reduced to suppress color nonuniformity.

The bottom-layer second insulating film 21a, the middle-layer second insulating film 21b, and the top-layer second insulating film 21c may be formed using the same material, or partially or completely different materials may be used for these three films. For example, by using materials having different refractive indices, the refractive index of the second insulating film 21 can be adjusted for each different color.

Fourth Embodiment

Configuration of Solid-State Imaging Device

Figure 14:
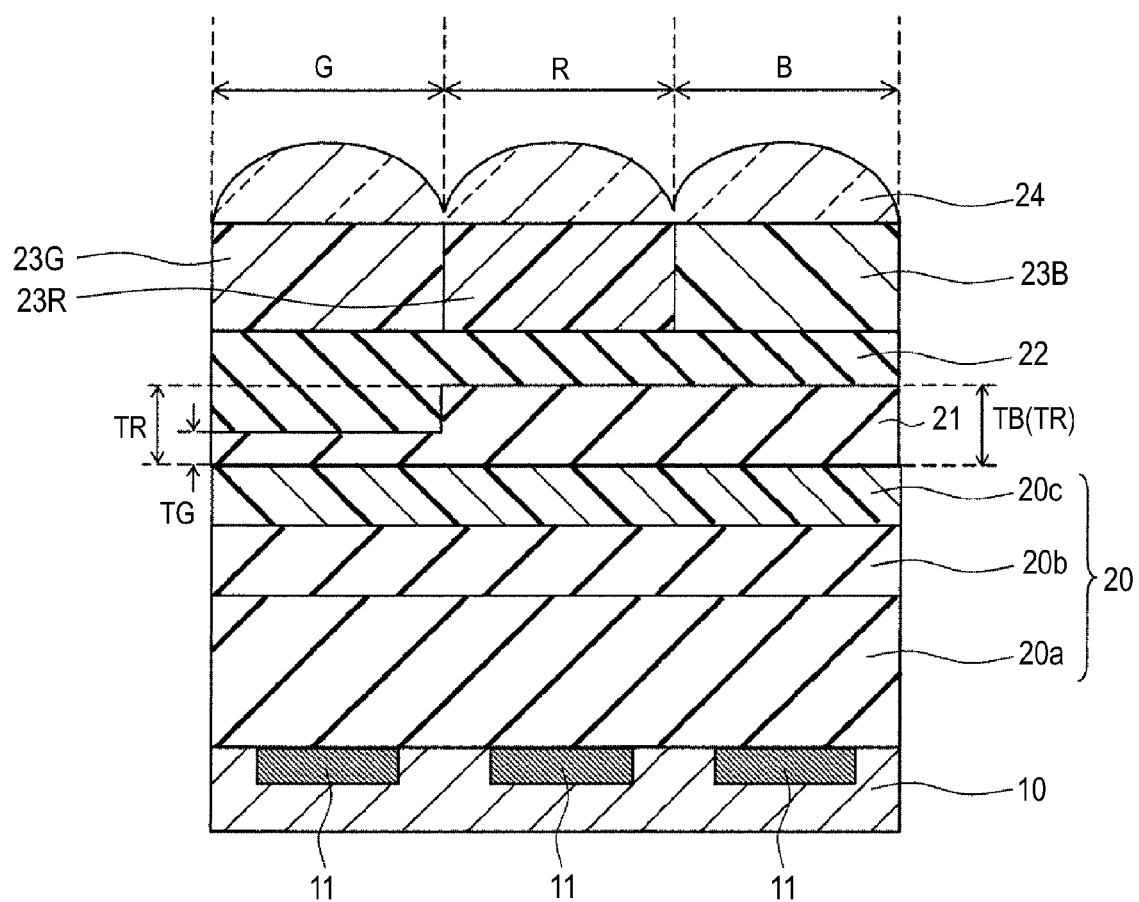
FIG. 14 is a cross sectional view of pixels of a solid-state imaging device according to Fourth Embodiment of the present invention.

FIG. 14 is a cross sectional view of pixels of a solid-state imaging device according to the present embodiment.

In the present embodiment, the thickness TR of the second insulating film 21 for the red pixel (R) is the same as the thickness TB of the second insulating film 21 for the blue pixel (B). The thickness TG of the second insulating film 21 for the green pixel (G) differs from the thickness TR of the second insulating film 21 for the red pixel (R), and the thickness TB of the second insulating film 21 for the blue pixel (B).

For example, the thicknesses of the second insulating film 21 are set to 100 nm, 40 nm, and 100 nm for the red pixel (R), green pixel (G), and blue pixel (B), respectively.

The other configuration is essentially the same as the solid-state imaging device of First Embodiment.

Figure 15:
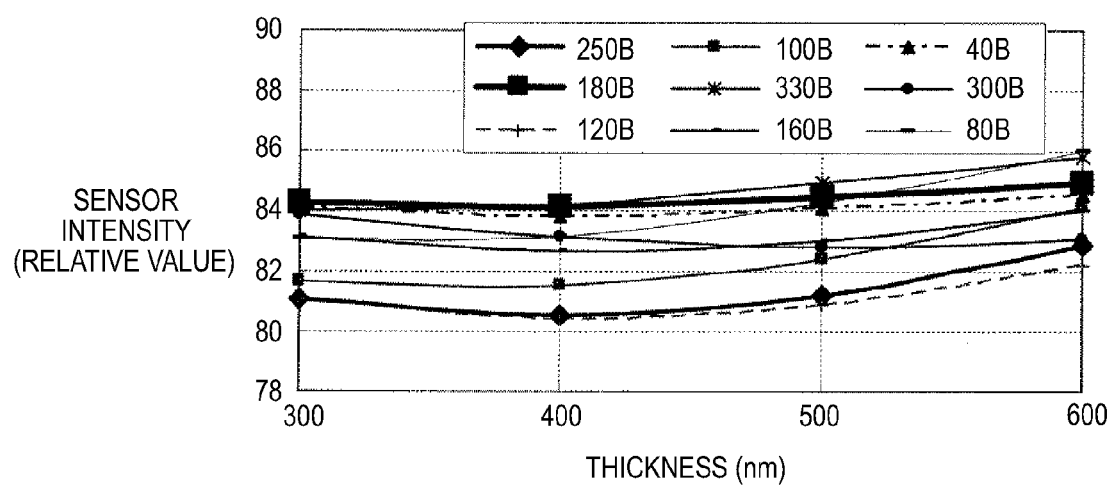
FIG. 15 is a diagram representing the relationship between sensor intensity and the thickness of a bottom-layer second insulating film in the solid-state imaging device according to Fourth Embodiment of the present invention.

FIG. 15 represents the relationship between the sensor intensity of the blue pixel (B) and the thickness of the middle-layer first insulating film 20b under varying thicknesses of the second insulating film 21 over the range of 40 nm to 330 nm.

Because the thickness dependence of the sensor intensity on the middle-layer first insulating film 20b for the blue pixel (B) is not as large as that for the green pixel (G) or red pixel (R), the same thickness can be set for the thickness TB for the blue pixel (B) and the thickness TR for the red pixel (R) in the second insulating film 21.

In the present embodiment, as in Third Embodiment, the second insulating film 21 may be provided as the laminate of multiple layers, and different materials may be used for these layers. In this way, the refractive index of the second insulating film 21 can be adjusted for the pixel of each color, and a film type with an optimum refractive index can be selected.

With the solid-state imaging device of the present embodiment, variation in the optical interference intensity of the incident light on the light-receiving surface can be reduced to suppress color nonuniformity, for example, in the generation of solid-state imaging device that forms color images particularly with a cell pitch of 3 µm or less.

The solid-state imaging device can be manufactured by essentially the same method described in First Embodiment, except that the second insulating film 21 is formed to have the same thicknesses, TR and TB, for the red pixel (R) and blue pixel (B), respectively.

With the solid-state imaging device manufacturing method of the present embodiment, a solid-state imaging device, for example, the generation of solid-state imaging device that forms color images particularly with a cell pitch of 3 µm or less can be manufactured in which variation in the optical interference intensity of the incident light on the light-receiving surface can be reduced to suppress color nonuniformity.

By forming the second insulating film 21 in the same thickness for the blue pixel (B) and the red pixel (R), the processing steps can be reduced, and the solid-state imaging device manufacturing method can be simplified.

[Variation]

Figure 16:
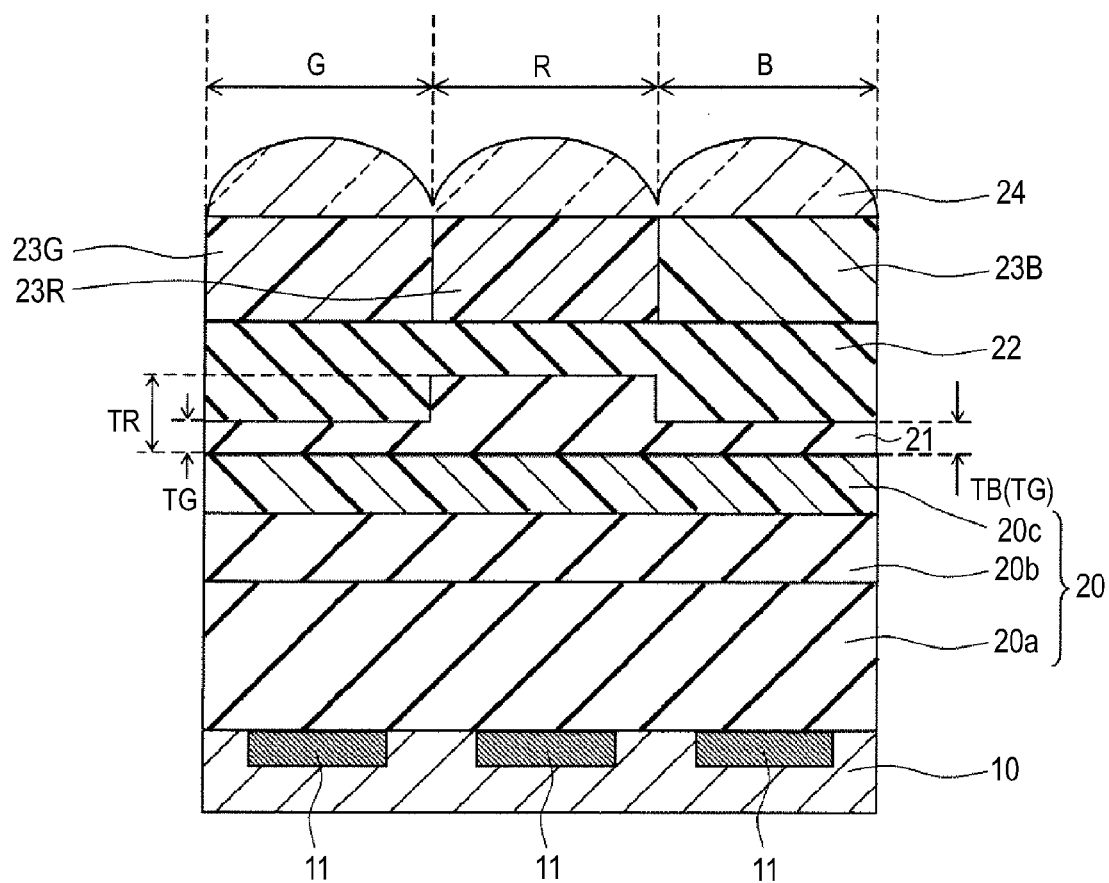
FIG. 16 is a cross sectional view of pixels of the solid-state imaging device according to Fourth Embodiment of the present invention.

FIG. 16 is a cross sectional view of pixels of a solid-state imaging device according to a variation example of the foregoing Fourth Embodiment.

In this embodiment, the thickness TG of the second insulating film 21 for the green pixel (G) is the same as the thickness TB of the second insulating film 21 for the blue pixel (B). The thickness TR of the second insulating film 21 for the red pixel (R) differs from the thickness TG of the second insulating film 21 for the green pixel (G), and the thickness TB of the second insulating film 21 for the blue pixel (B).

For example, the thicknesses of the second insulating film 21 are set to 100 nm, 40 nm, and 40 nm for the red pixel (R), green pixel (G), and blue pixel (B), respectively.

The other configuration is essentially the same as the solid-state imaging device of the foregoing Fourth Embodiment.

As above, because the thickness dependence of the sensor intensity on the middle-layer first insulating film 20b for the blue pixel (B) is not as large as that for the green pixel (G) or red pixel (R), the same thickness can be set for the thickness TB for the blue pixel (B) and the thickness TG for the green pixel (G) in the second insulating film 21.

With the solid-state imaging device of the present embodiment, variation in the optical interference intensity of the incident light on the light-receiving surface can be reduced to suppress color nonuniformity, for example, in the generation of solid-state imaging device that forms color images particularly with a cell pitch of 3 μm or less.

The solid-state imaging device can be manufactured by essentially the same method described in First Embodiment, except that the second insulating film 21 is formed to have the same thicknesses, TG and TB, for the green pixel (G) and blue pixel (B), respectively.

With the solid-state imaging device manufacturing method of the present embodiment, a solid-state imaging device, for example, the generation of solid-state imaging device that forms color images particularly with a cell pitch of 3 μm or less can be manufactured in which variation in the optical interference intensity of the incident light on the light-receiving surface can be reduced to suppress color nonuniformity.

By forming the second insulating film 21 in the same thickness for the blue pixel (B) and the green pixel (G), the processing steps can be reduced, and the solid-state imaging device manufacturing method can be simplified.

Fifth Embodiment

Solid-State Imaging Device Designing Method

The present embodiment is a designing method of the solid-state imaging devices of the foregoing embodiments.

The configuration of the solid-state imaging device is as described in the foregoing First to Fourth Embodiments.

According to the designing method of the present embodiment, the solid-state imaging device is designed so that the thickness and/or second refractive index of the second insulating film 21 for the pixel with anyone of the red, green, and blue color filters differ from the thickness and/or second refractive index of the second insulating film 21 for the other pixels.

The device is designed in such a manner as to reduce variation in the optical interference intensity between the reflected light at the surface of the semiconductor substrate 10, and the reflected light at the interfaces between the first insulating film 20 and the second insulating film 21 and between the second insulating film 21 and the third insulating film 22.

Specifically, for example, the device is designed as follows.

The following parameters are designed so as to maximize the light intensity $\phi^2$ received by the photodiode, and to minimize amplitude $\phi$ in the equations (1) to (3) below.

Thickness Xr and second refractive index Nr of the second insulating film for the red pixel Thickness Xg and second refractive index Ng of the second insulating film for the green pixel Thickness Xb and second refractive index Nb of the second insulating film for the blue pixel Thickness $X_i$ and refractive index $N_i$ of all the layers from the semiconductor substrate to the bottom of the color filter, excluding the second insulating film The number of layers T including the semiconductor substrate, excluding the second insulating film By using these parameters, the values of Xr, Nr, Xg, Ng, Xb, and Nb that maximize light intensity $\phi^2$ and minimize amplitude $\phi$ are determined.

$$\phi^2 = \sum_{i=1}^{i=T} f(X_i * N_i) * (Xr * Nr) \quad (1)$$

$$\phi^2 = \sum_{i=1}^{i=T} f(X_i * N_i) * (Xg * Ng) \quad (2)$$

$$\phi^2 = \sum_{i=1}^{i=T} f(X_i * N_i) * (Xb * Nb) \quad (3)$$

In the equations (1) to (3), f is a predetermined function, which can be treated, for example, as represented by the following equations (1a) to (3a).

$$\phi^2 = \sum_{i=1}^{i=T} (X_i * N_i) * (Xr * Nr) \quad (1a)$$

$$\phi^2 = \sum_{i=1}^{i=T} (X_i * N_i) * (Xg * Ng) \quad (2a)$$

$$\phi^2 = \sum_{i=1}^{i=T} (X_i * N_i) * (Xb * Nb) \quad (3a)$$

For example, the device is designed so as to maximize light intensity $\phi^2$ and to minimize amplitude $\phi$ in the equations (1) to (3), preferably with the exclusion of a layer having a refractive index smaller than a predetermined value from the layers that include all the layers from the semiconductor substrate to the bottom of the color filter excluding the second insulating film.

The predetermined value of refractive index can be appropriately selected, and the exclusion of a film that has a small refractive index and thus has only a small influence allows the simulation to be performed more easily.

The solid-state imaging device of the present embodiment is configured so that the first insulating film having a lower refractive index than the semiconductor substrate for at least the bottom surface and top surface portions of the first insulating film is formed on the semiconductor substrate, and that the second insulating film having a higher refractive index than the bottom surface and top surface portions of the first insulating film is formed thereon.

Because the total thickness of the device calculated as the sum of the thicknesses of the low-refractive-index insulating film, the high-refractive-index insulating film, and the second insulating film is the light path length $\phi$, the thickness of the second insulating film 21 that would minimize the amplitude for each incident wavelength is determined from the equations (1) to (3) or equations (1a) to (3a).

The device fabricated with the thickness and refractive index so determined has strong sensor intensity with no thickness dependence on the interlayer insulating film and without color nonuniformity.

In the present embodiment, the thickness and refractive index are optimized for each of the red pixel (R), green pixel (G), and blue pixel (B). However, it is not necessarily required to vary thickness and refractive index for each pixel, and the same film type may be used when there are limitations in film type, or depending on process conditions.

In this case, the device can be fabricated to include the second insulating film 21 of, for example, the same film type or the same thickness for the red pixel (R) and the blue pixel (B).

In the present embodiment, the small amplitude in the graph is used as a factor to determine the thickness of the second insulating film. However, the thickness may be determined, for example, from the local maximum point of sensor intensity for each of the red pixel (R), green pixel (G), and blue pixel (B) by solving a sensor intensity-thickness function.

Figure 17:
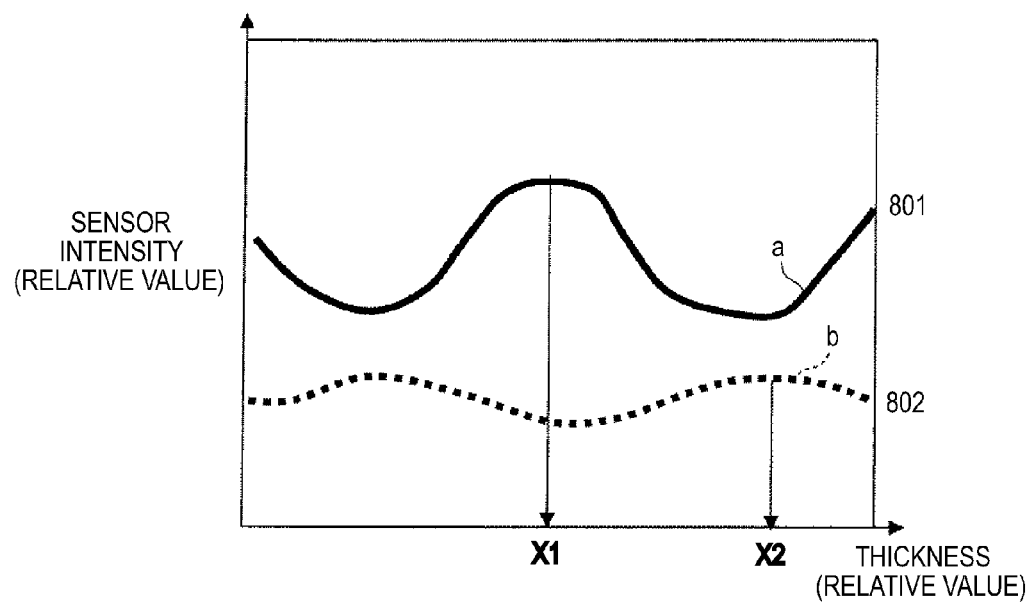
FIG. 17 is a diagram explaining a method for designing the thickness of a third insulating film in a solid-state imaging device according to Fifth Embodiment of the present invention.
Figure 18:
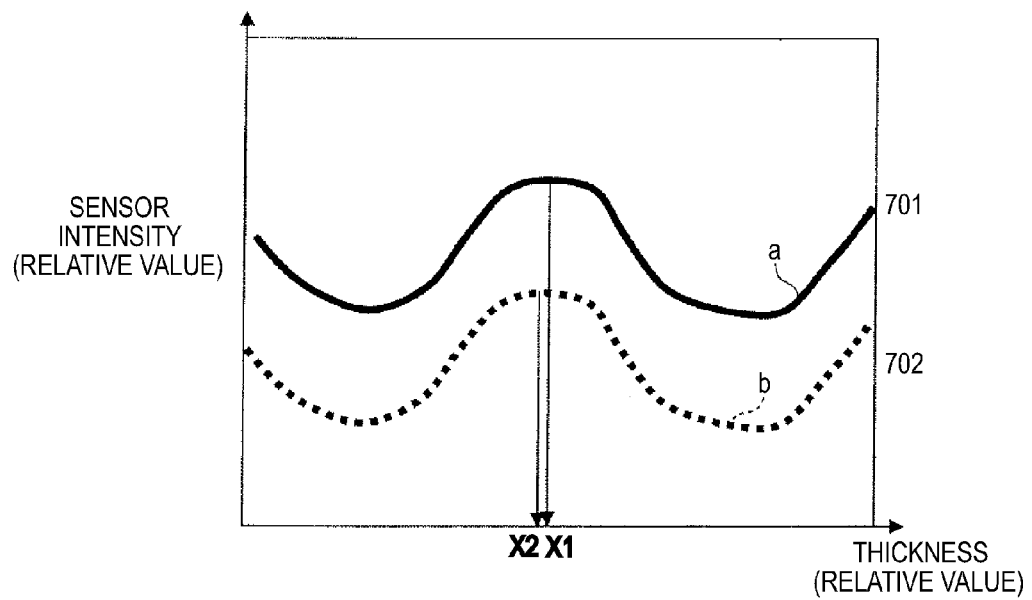
FIG. 18 is a diagram explaining a method for designing the thickness of the third insulating film in the solid-state imaging device according to Fifth Embodiment of the present invention.

FIG. 17 and FIG. 18 represent the thickness dependence of sensor intensity on the middle-layer first insulating film 20b for the green pixel receiving 550 nm light (solid line a), and for the red pixel receiving 620 nm light (dotted line b), with the thickness of the second insulating film 21 set to a predetermined value.

For example, as represented in FIG. 17, X1 and X2 can be regarded as the optimum thicknesses for the green pixel (G) and red pixel (R), respectively.

When the thicknesses that give the local maxima in the graph are close together, the same thickness value may be used. Specifically, the thickness values that give the local maxima can be regarded as the same when the curves in the graph are in phase, as in FIG. 18.

With the solid-state imaging device designing method of the present embodiment, a solid-state imaging device, for example, the generation of solid-state imaging device that forms color images particularly with a cell pitch of 3 μm or less can be designed in which variation in the optical interference intensity of the incident light on the light-receiving surface can be reduced to suppress color nonuniformity.

Sixth Embodiment

The present embodiment is a designing method of the solid-state imaging devices according to the foregoing embodiments.

The configuration of the solid-state imaging device is as described in the foregoing First to Fourth Embodiments.

According to the designing method of the present embodiment, the solid-state imaging device is designed so that the thickness and/or second refractive index of the second insulating film 21 for the pixel with anyone of the red, green, and blue color filters differ from the thickness and/or second refractive index of the second insulating film 21 for the pixels of the other colors.

The device is designed in such a manner as to reduce variation in the optical interference intensity between the reflected light at the surface of the semiconductor substrate 10, and the reflected light at the interfaces between the first insulating film 20 and the second insulating film 21 and between the second insulating film 21 and the third insulating film 22.

Specifically, for example, the device is designed as follows.

The following parameters are designed so as to minimize the optical interference intensity I received by the photodiode in the equations (4) to (6) below.

Thickness Xr and second refractive index Nr of the second insulating film for the red pixel Wavelength λr of red light Thickness Xg and second refractive index Ng of the second insulating film for the green pixel Wavelength λg of green light Thickness Xb and second refractive index Nb of the second insulating film for the blue pixel Wavelength λb of blue light Thickness $X_i$ and refractive index $N_i$ of all the layers from the semiconductor substrate to the bottom of the color filter, excluding the second insulating film The number of layers T including the semiconductor substrate, excluding the second insulating film By using these parameters, the values of Xr, Nr, Xg, Ng, Xb, and Nb that minimize optical interference intensity I are determined.

$$I = \sum_{i=1}^{i=T} f(X_i * N_i / \lambda r) * (Xr * Nr / \lambda r) \quad (4)$$

$$I = \sum_{i=1}^{i=T} f(X_i * N_i / \lambda g) * (Xg * Ng / \lambda g) \quad (5)$$

$$I = \sum_{i=1}^{i=T} f(X_i * N_i / \lambda b) * (Xb * Nb / \lambda b) \quad (6)$$

In the equations (4) to (6), f is a predetermined function, which can be treated, for example, as represented by the following equations (4a) to (6a).

$$I = \sum_{i=1}^{i=T} (X_i * N_i / \lambda r) * (Xr * Nr / \lambda r) \quad (4a)$$

$$I = \sum_{i=1}^{i=T} (X_i * N_i / \lambda g) * (Xg * Ng / \lambda g) \quad (5a)$$

$$I = \sum_{i=1}^{i=T} (X_i * N_i / \lambda b) * (Xb * Nb / \lambda b) \quad (6a)$$

For example, the device is designed so as to minimize optical interference intensity I in the equations (4) to (6), preferably with the exclusion of a layer having a refractive index smaller than a predetermined value from the layers that include all the layers from the semiconductor substrate to the bottom of the color filter excluding the second insulating film.

The predetermined value of refractive index can be appropriately selected, and the exclusion of a film that has a small refractive index and thus has only a small influence allows the simulation to be performed more easily.

The solid-state imaging device of the present embodiment is configured so that the first insulating film having a lower refractive index than the semiconductor substrate for at least the bottom surface and top surface portions of the first insulating film is formed on the semiconductor substrate, and that the second insulating film having a higher refractive index than the bottom surface and top surface portions of the first insulating film is formed thereon.

The thickness of the second insulating film 21 that would minimize the optical interference intensity for each incident wavelength is determined according to the equations (4) to (6) or the equations (4a) to (6a).

With the solid-state imaging device designing method of the present embodiment, a solid-state imaging device, for example, the generation of solid-state imaging device that forms color images particularly with a cell pitch of 3 μm or less can be designed in which variation in the optical interference intensity of the incident light on the light-receiving surface can be reduced to suppress color nonuniformity.

Seventh Embodiment

Application to Electronic Device

Figure 19:
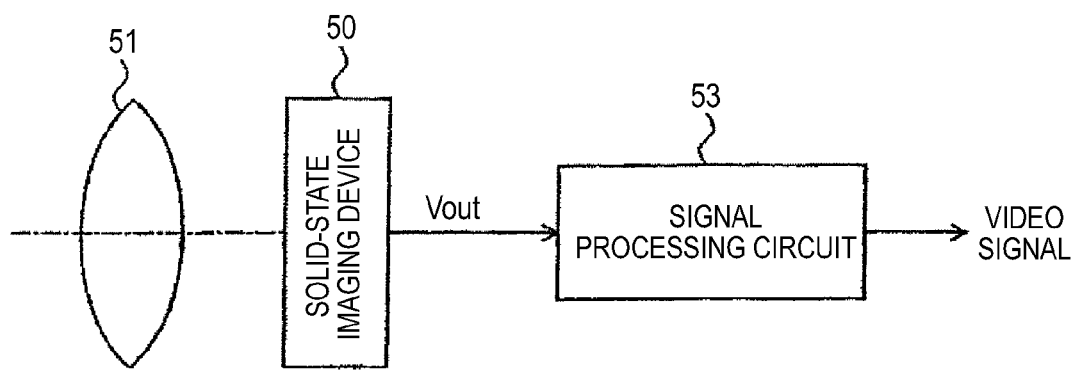
FIG. 19 is a schematic diagram of an electronic device according to Seventh Embodiment of the present invention.
Figure 22:
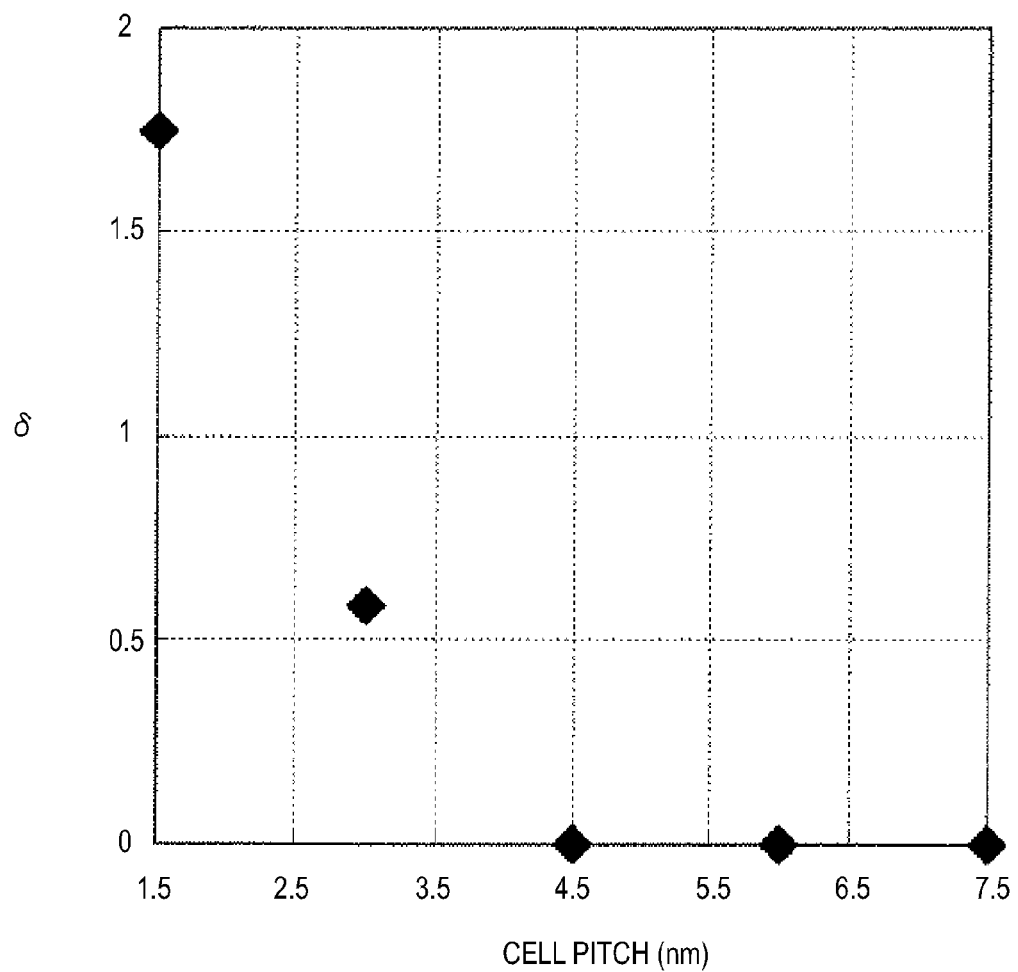
FIG. 22 is a graph representing sensitivity against cell pitch for red (R), green (G), and blue (B).

FIG. 19 is a schematic diagram of an electronic device according to the present embodiment. The electronic device according to the present embodiment is an example of a video electronic device capable of capturing still images or moving images.

The electronic device according to the present embodiment includes an image sensor (solid-state imaging device) 50, an optical system 51, and a signal processing circuit 53, among other components.

In the present embodiment, the solid-state imaging device according to First Embodiment is installed as the image sensor 50.

The optical system 51 forms a subject image (incident light) on the imaging surface of the image sensor 50. In response, signal charges accumulate in the image sensor 50 for certain time periods. The accumulated signal charges are extracted as output signals Vout.

A shutter unit controls the irradiation time and cutoff time of light for the image sensor 50.

An image processing unit supplies drive signals that control the transfer operation of the image sensor 50 and the shutter operation of the shutter unit. Signal transfer in the image sensor 50 is performed according to the drive signals (timing signals) supplied from the image processing unit. A signal processing circuit 53 outputs video signals after performing various kinds of signal processing on the output signals Vout of the image sensor 50. The video signals after signal processing are stored in a storage medium such as memory, or output to a monitor.

With the electronic device according to the present embodiment, variation in the optical interference intensity of the incident light on the light-receiving surface can be reduced to suppress color nonuniformity, for example, in an electronic device that includes the generation of solid-state imaging device that forms color images particularly with a cell pitch of 3 μm or less.

The presently described embodiment is based on an application using the image sensor 50 in which signal charges according to the quantity of visible light are detected as physical quantity by unit pixels disposed in rows and columns. However, the present invention is not limited to application to the image sensor 50. The invention is also applicable to generally all kinds of column-type solid-state imaging devices in which a column circuit is disposed for each pixel column of a pixel array section.

Further, the present invention is not limited to application to solid-state imaging devices that detect the distribution of the incident light quantity of visible light for imaging. The invention is also applicable to generally all kinds of solid-state imaging devices, including solid-state imaging devices that capture images from the distribution of incident quantities, for example, such as infrared rays, X rays, and particles, and solid-state imaging devices (physical quantity distribution detecting devices), such as fingerprint detecting sensors, that detect the distribution of other physical quantities, including pressure and capacitance in the broad sense, for imaging.

Further, the present invention is not limited to application to solid-state imaging devices, and is also applicable to electronic devices having imaging functions, including digital still electronic devices, video electronic devices, and mobile phones. Note that, the imaging device may be in the form of a module, or specifically an electronic device module, installed in an electronic device.

The image sensor 50 of the embodiment may be used as the solid-state imaging device for imaging devices such as electronic device modules for video electronic devices and digital still electronic devices, and for mobile devices such as mobile phones.

The present invention is not limited to the foregoing descriptions.

For example, in an embodiment of the present invention, the invention is also applicable to both CMOS sensors and CCD devices.

In addition, various modifications can be made without departing from the gist of the present invention.

The present application contains subject matter related to that disclosed in Japanese Priority Patent Application JP 2009-255445 filed in the Japan Patent Office on Nov. 6, 2009, the entire contents of which is hereby incorporated by reference.

What is claimed is:

1. A solid-state imaging device comprising:
   a semiconductor substrate;
   a plurality of photodiodes on the semiconductor substrate; the plurality of photodiodes including a first photodiode associated with a first pixel, a second photodiode associated with a second pixel, and a third photodiode associated with a third pixel;
   a first insulating film on the semiconductor substrate to cover multilayer wiring on the semiconductor substrate, the first insulating film having a first refractive index lower than a refractive index of the semiconductor substrate for at least bottom surface and top surface portions of the first insulating film;
   a second insulating film having a second refractive index higher than the first refractive index and being disposed on the first insulating film;
   a third insulating film having a third refractive index higher than the second refractive index and being disposed on the second insulating film; and
   a color filter on the third insulating film, the color filter having at least a first color region for the first pixel to transmit a first color, a second color region for the second pixel to transmit a second color, and a third color region for the third pixel to transmit a third color,
   wherein,
      the second insulating film is provided in each of the first, second, and third pixels, the second insulating film having a step difference between adjacent pixels,
      the third insulating film planarizes the step difference of the second insulating film to provide a planar surface for the color filter, and
      a thickness and/or the second refractive index of the second insulating film of the first pixel differs from the thickness and/or the second refractive index of the second insulating film of the second pixel so as to reduce a variation in intensity of optical interference between reflected light at a surface of the semiconductor substrate, and reflected light at interfaces between the first insulating film and the second insulating film and between the second insulating film and the third insulating film.

2. The solid-state imaging device according to claim 1, wherein the third insulating film is a protective film made of silicon nitride.

3. The solid-state imaging device according to claim 1, wherein the second insulating film has different thicknesses for the first pixel, the second pixel, and the third pixel.

4. The solid-state imaging device according to claim 1, wherein the thickness and/or the second refractive index of the second insulating film at portions associated with transmissions of any two of red light, green light, and blue light are set so as to reduce variation in the intensity of optical interference between the reflected light at the surface of the semiconductor substrate, and the reflected light at the interfaces between the first insulating film and the second insulating film and between the second insulating film and the third insulating film.

5. The solid-state imaging device according to claim 1, wherein the thickness and/or the second refractive index of the second insulating film are the same at a portion associated with a transmission of blue light and a portion associated with a transmission of any one of red light and green light.

6. The solid-state imaging device according to claim 1, wherein the thickness of the second insulating film at a portion associated with a transmission of red light differs from the thickness of the second insulating film at a portion associated with a transmission of green light by the difference (wavelength of red light/4-wavelength of green light/4), and wherein the thickness of the second insulating film at a portion associated with a transmission of green light differs from the thickness of the second insulating film at a portion associated with a transmission of blue light by the difference (wavelength of green light/4-wavelength of blue light/4).

7. A method for manufacturing a solid-state imaging device, the method comprising the steps of:
forming a plurality of photodiodes on a semiconductor substrate, the plurality of photodiodes including a first photodiode associated with a first pixel, a second photodiode associated with a second pixel, and a third photodiode associated with a third pixel;
forming multilayer wiring on the semiconductor substrate, and forming a first insulating film on the semiconductor substrate so as to cover the multilayer wiring, the first insulating film having a first refractive index lower than a refractive index of the semiconductor substrate for at least bottom surface and top surface portions of the first insulating film;
forming a second insulating film having a second refractive index higher than the first refractive index on the first insulating film;
forming a third insulating film having a third refractive index higher than the second refractive index on the second insulating film; and
forming a color filter on the third insulating film, the color filter having at least a first color region for the first pixel to transmit a first color, a second color region for the second pixel to transmit a second color, and a third color region for the third pixel to transmit a third color,
wherein,
the second insulating film is provided in each of the first, second, and third pixels, the second insulating film having a step difference between adjacent pixels,
the third insulating film planarizes the step difference of the second insulating film to provide a planar surface for the color filter, and
in the step of forming the second insulating film, a thickness and/or the second refractive index of the second insulating film for the first pixel differs from the thickness and/or the second refractive index of the second insulating film for the second pixel so as to reduce variation in intensity of optical interference between reflected light at a surface of the semiconductor substrate, and reflected light at interfaces between the first insulating film and the second insulating film and between the second insulating film and the third insulating film.

8. The method according to claim 7, wherein, in the step of forming the second insulating film, the second insulating film is formed to have a same thickness for the first, second, and third pixels before a part of the second insulating film is removed so that the thickness of the second insulating film for the first pixel differs from that of the second pixel.

9. The method according to claim 7, wherein, in the step of forming the second insulating film, the second insulating film is formed as a laminated insulating film, and a part of the laminated insulating film is removed to provide different thicknesses of the second insulating film for the first, second, and third pixels.

10. A method for designing a solid-state imaging device that includes (a) a semiconductor substrate, (b) a plurality of photodiodes on the semiconductor substrate, the plurality of photodiodes including a first photodiode associated with a first pixel, a second photodiode associated with a second pixel, and a third photodiode associated with a third pixel, (c) a first insulating film on the semiconductor substrate to cover multilayer wiring on the semiconductor substrate, the first insulating film having a first refractive index lower than a refractive index of the semiconductor substrate for at least bottom surface and top surface portions of the first insulating film, (d) a second insulating film having a second refractive index higher than the first refractive index formed on the first insulating film, (e) a third insulating film having a third refractive index higher than the second refractive index and being disposed on the second insulating film, and (f) a color filter on the third insulating film, the color filter having at least a first color region for the first pixel to transmit a first color, a second color region for the second pixel to transmit a second color, and a third color region for the third pixel to transmit a third color, said method comprising:
designing the solid-state imaging device in such a manner that a thickness and/or the second refractive index of the second insulating film for the first pixel differs from the thickness and/or the second refractive index of the second insulating film for the second pixel, and a variation in intensity of optical interference between reflected light at a surface of the semiconductor substrate, and reflected light at interfaces between the first insulating film and the second insulating film and between the second insulating film and the third insulating film is reduced,
wherein,
said designing includes:
forming the second insulating film in each of the first, second, and third pixels, the second insulating film having a step between adjacent pixels, and
forming the third insulating film to planarize the step difference of the second insulating film and provide a planar surface for the color filter.

11. The method according to claim 10, further comprising:
designing the thickness Xr and second refractive index Nr of the second insulating film at a portion associated with a transmission of red light, the thickness Xg and second refractive index Ng of the second insulating film at a portion associated with a transmission of green light, and the thickness Xb and second refractive index Nb of the second insulating film at a portion associated with a transmission of blue light to maximize the light intensity $\Phi^2$ received by the photodiode and to minimize amplitude $\Phi$ in the following equations (1) to (3), $$\Phi^2 = \sum_{i=1}^{i=T} f(X_i * N_i) * (Xr * Nr) \quad (1)$$

$$\Phi^2 = \sum_{i=1}^{i=T} f(X_i * N_i) * (Xg * Ng) \quad (2)$$

$$\Phi^2 = \sum_{i=1}^{i=T} f(X_i * N_i) * (Xb * Nb) \quad (3)$$

where f is a function defined by at least $X_i$ and $N_i$, and Xr and Nr are the thickness and the second refractive index, respectively, of the second insulating film at the portion associated with the transmission of red light, Xg and Ng are the thickness and the second refractive index, respectively, of the second insulating film at the portion associated with the transmission of green light, Xb and Nb are the thickness and the second refractive index, respectively, of the second insulating film at the portion associated with the transmission of blue light, $X_i$ and $N_i$ are the thickness and the refractive index, respectively, of each layer taken from the semiconductor substrate to a bottom of the color filter, excluding the second insulating film, and where i represents an integer value of 1 to T, and where T is the number of layers including the semiconductor substrate, excluding the second insulating film.

12. The method according to claim 11, wherein the light intensity $\Phi^2$ is maximized and the amplitude $\Phi$ is minimized in the equations (1) to (3) with the exclusion of a layer having a refractive index smaller than a predetermined value from layers that include all the layers from the semiconductor substrate to the bottom of the color filter excluding the second insulating film.

13. The method according to claim 10, further comprising:
designing the thickness Xr and second refractive index Nr of the second insulating film at a portion associated with a transmission of red light, the thickness Xg and second refractive index Ng of the second insulating film at a portion associated with a transmission of green light, and the thickness Xb and second refractive index Nb of the second insulating film at a portion associated with a transmission of blue light to minimize optical interference intensity I in the following equations (4) to (6), $$I = \sum_{i=1}^{i=T} f(X_i * N_i / \lambda r) * (Xr * Nr / \lambda r) \quad (4)$$

$$I = \sum_{i=1}^{i=T} f(X_i * N_i / \lambda g) * (Xg * Ng / \lambda g) \quad (5)$$

$$I = \sum_{i=1}^{i=T} f(X_i * N_i / \lambda b) * (Xb * Nb / \lambda b) \quad (3)$$

where f is a function defined by at least $X_i$ and $N_i$, and Xr and Nr are the thickness and the second refractive index, respectively, of the second insulating film at the portion associated with the transmission of red light, λr is the wavelength of red light, Xg and Ng are the thickness and the second refractive index, respectively, of the second insulating film at the portion associated with the transmission of green light, λg is the wavelength of green light, Xb and Nb are the thickness and the second refractive index, respectively, of the second insulating film at the portion associated with the transmission of blue light, λb is the wavelength of blue light, $X_i$ and $N_i$ are the thickness and the refractive index, respectively, of each layer taken from the semiconductor substrate to a bottom of the color filter, excluding the second insulating film, and where i represents an integer value of 1 to T, where T is the number of layers including the semiconductor substrate, excluding the second insulating film.

14. The method according to claim 13, wherein the optical interference intensity I is minimized in the equations (4) to (6) with the exclusion of a layer having a refractive index smaller than a predetermined value from layers that include all the layers from the semiconductor substrate to the bottom of the color filter excluding the second insulating film.

15. An electronic device comprising:
a solid-state imaging device;
an optical system that guides incident light to an imaging section of the solid-state imaging device; and
a signal processing circuit that processes an output signal of the solid-state imaging device,
wherein
the solid-state imaging device includes:
a semiconductor substrate,
a plurality of photodiodes on the semiconductor substrate, the plurality of photodiodes including a first photodiode associated with a first pixel, a second photodiode associated with a second pixel, and a third photodiode associated with a third pixel;
a first insulating film on the semiconductor substrate so as to cover multilayer wiring on the semiconductor substrate, the first insulating film having a first refractive index lower than a refractive index of the semiconductor substrate for at least bottom surface and top surface portions of the first insulating film,
a second insulating film having a second refractive index higher than the first refractive index formed on the first insulating film,
a third insulating film having a third refractive index higher than the second refractive index formed on the second insulating film, and
a color filter on the third insulating film, the color filter having at least a first color region for the first pixel to transmit a first color, a second color region for the second pixel to transmit a second color, and a third color region for the third pixel to transmit a third color,
wherein,
the second insulating film is provided in each of the first, second, and third pixels, the second insulating film having a step difference between adjacent pixels,
the third insulating film planarizes the step difference of the second insulating film to provide a planar surface for the color filter, and
a thickness and/or the second refractive index of the second insulating film of the first pixel differs from the thickness and/or the second refractive index of the second insulating film of the second pixel so as to reduce variation in intensity of optical interference between reflected light at a surface of the semiconductor substrate, and reflected light at interfaces between the first insulating film and the second insulating film and between the second insulating film and the third insulating film.

* * * * *